United States Patent
Kim

(10) Patent No.: US 11,025,255 B2
(45) Date of Patent: Jun. 1, 2021

(54) SIGNAL GENERATION CIRCUIT SYNCHRONIZED WITH A CLOCK SIGNAL AND A SEMICONDUCTOR APPARATUS USING THE SAME

(71) Applicant: SK hynix Inc., Icheon-si (KR)

(72) Inventor: Young Ouk Kim, Icheon-si (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/810,571

(22) Filed: Mar. 5, 2020

(65) Prior Publication Data

US 2021/0050855 A1    Feb. 18, 2021

(30) Foreign Application Priority Data

Aug. 16, 2019 (KR) .................. 10-2019-0100225

(51) Int. Cl.
| | |
|---|---|
| H03K 21/00 | (2006.01) |
| H03K 21/08 | (2006.01) |
| H03K 5/156 | (2006.01) |
| H03K 3/017 | (2006.01) |
| H03K 21/02 | (2006.01) |

(52) U.S. Cl.
CPC ............ H03K 21/08 (2013.01); H03K 3/017 (2013.01); H03K 5/1565 (2013.01); H03K 21/026 (2013.01)

(58) Field of Classification Search
None
See application file for complete search history.

(56) References Cited

U.S. PATENT DOCUMENTS

| | | | | |
|---|---|---|---|---|
| 2011/0025381 | A1* | 2/2011 | Yamahira | G06F 1/06 327/115 |
| 2012/0106263 | A1* | 5/2012 | Kim | G11C 29/14 365/189.02 |
| 2018/0191355 | A1* | 7/2018 | Dusad | H03L 7/16 |
| 2018/0336937 | A1* | 11/2018 | Yoon | G11C 7/1066 |
| 2019/0267058 | A1* | 8/2019 | Park | G11C 7/1087 |
| 2019/0384350 | A1* | 12/2019 | Jang | G06F 1/12 |
| 2020/0228123 | A1* | 7/2020 | Oh | H03L 7/0812 |

FOREIGN PATENT DOCUMENTS

KR    1020200088650 A    7/2020

* cited by examiner

*Primary Examiner* — Tuan T Lam

(74) *Attorney, Agent, or Firm* — William Park & Associates Ltd.

(57) ABSTRACT

A signal generation circuit includes a clock divider circuit, an off-pulse generation circuit, and an output signal generation circuit. The on-pulse generation circuit delays an input signal in synchronization with the first and second divided clock signals and generates an even on-pulse signal and an odd on-pulse signal. The off-pulse generation circuit delays the even on-pulse signal and the odd-on pulse signal in synchronization with the first divided clock signal and the second divided clock signal and generates a plurality of delay signals. The output signal generation circuit generates a first pre-output signal based on the delay signals delayed in synchronization with the first divided clock signal, generate a second pre-output signal based on the delay signals delayed in synchronization with the second divided clock signal, and generate an output signal based on the first and second pre-output signals.

17 Claims, 11 Drawing Sheets

SIGNAL GENERATION CIRCUIT SYNCHRONIZED WITH A CLOCK SIGNAL AND A SEMICONDUCTOR APPARATUS USING THE SAME

CROSS-REFERENCES TO RELATED APPLICATION

The present application claims priority under 35 U.S.C. § 119(a) to Korean application number 10-2019-0100225, filed on Aug. 16, 2019, in the Korean Intellectual Property Office, which is incorporated herein by reference in its entirety.

BACKGROUND

1. Technical Field

Various embodiments generally relate to an integrated circuit technology, and more particularly, to a semiconductor apparatus which can operate in synchronization with a clock signal.

2. Related Art

An electronic device may include many electronic components. A computer system, for example, may include a large number of semiconductor apparatuses composed of semiconductors. The semiconductor apparatuses constituting the computer system may communicate with each other while transmitting and receiving clocks and data. The semiconductor apparatuses may operate in synchronization with a clock signal. The semiconductor apparatuses may internally generate various signals based on a signal transferred from an external device. The various signals may be delayed and generated by internal circuits of the semiconductor apparatuses. The delay may include synchronous delay and asynchronous delay. For example, a memory apparatus such as a DRAM (Dynamic Random Access Memory) may generate internal signals by using the synchronous delay for data and clock signals related to the data, and generate internal signals by using the asynchronous delay for control signals, such as a command signal and address signal, other than the data. However, when receiving or outputting data, the semiconductor apparatuses need to perform an operation of synchronizing the internal signals generated through the asynchronous delay with a clock signal again. Such an operation may be referred to as domain crossing. With the increase in operating speed of the computer system or the semiconductor system, the frequency of the clock signal is continuously increased. In order to secure a margin required for internally processing a signal, the semiconductor apparatuses generate a divided clock signal having a low frequency by dividing the clock signal having a high frequency, and use the divided clock signal.

SUMMARY

In an embodiment, a signal generation circuit may include a clock divider circuit, an on-pulse generation circuit, an off pulse generation circuit, and an output circuit. The clock divider circuit may be configured to generate a first divided clock signal, a second divided clock signal, a third divided clock signal, and a fourth divided clock signal based on a clock signal. The on-pulse generation circuit may be configured to generate an even on-pulse signal and an odd on-pulse signal by delaying an input signal in synchronization with the first and second divided clock signals, based on first delay information. The off-pulse generation circuit may be configured to generate even delay signals of a plurality of delay signals by sequentially delaying the even on-pulse signal alternately in synchronization with the second divided clock signal and the first divided clock signal, based on second delay information, and generate odd delay signals of a plurality of delay signals by sequentially delaying the odd on-pulse signal alternately in synchronization with the first divided clock signal and the second divided clock signal, based on the second delay information. The output signal generation circuit may be configured to generate a first pre-output signal based on the even on-pulse signal and the delay signals delayed in synchronization with the second divided clock signal, among the plurality of delay signals, generate a second pre-output signal based on the odd on-pulse signal and the delay signals delayed in synchronization with the first divided clock signal, among the plurality of delay signals, and generate an output signal by synchronizing the first pre-output signal with the fourth divided clock signal and synchronizing the second pre-output signal with the third divided clock signal.

In an embodiment, a signal generation circuit may include a clock divider circuit, an on-pulse generation circuit, an off-pulse generation circuit, and an output circuit. The clock divider circuit may be configured to generate a first divided clock signal, a second divided clock signal, a third divided clock signal, and a fourth divided clock signal based on a clock signal. The on-pulse generation circuit may be configured to generate an even on-pulse signal and an odd on-pulse signal by delaying an input signal in synchronization with the first divided clock signal and the second divided clock signal, based on first delay information. The off-pulse generation circuit may be configured to generate even delay signals of a plurality of delay signals by delaying the even on-pulse signal alternately in synchronization with the third divided clock signal and the fourth divided clock signal, based on the second delay information, and generate odd delay signals of a plurality of delay signals by delaying the odd on-pulse signal alternately in synchronization with the fourth divided clock signal and the third divided clock signal, based on the second delay information. The output signal generation circuit may be configured to generate a first pre-output signal based on the delay signals delayed in synchronization with the third divided clock signal, generate a second pre-output signal based on the delay signals delayed in synchronization with the fourth divided clock signal, and generate an output signal by retiming the first pre-output signal based on the third divided clock signal and retiming the second pre-output signal based on the fourth divided clock signal.

DETAILED DESCRIPTION

Various embodiments are directed to signal generation circuits which can delay an input signal in synchronization with two or more two clock signals, and generate an output signal having a predetermined pulse width by summing up delayed signals according to the type of the synchronized clock signals.

Figure 1:
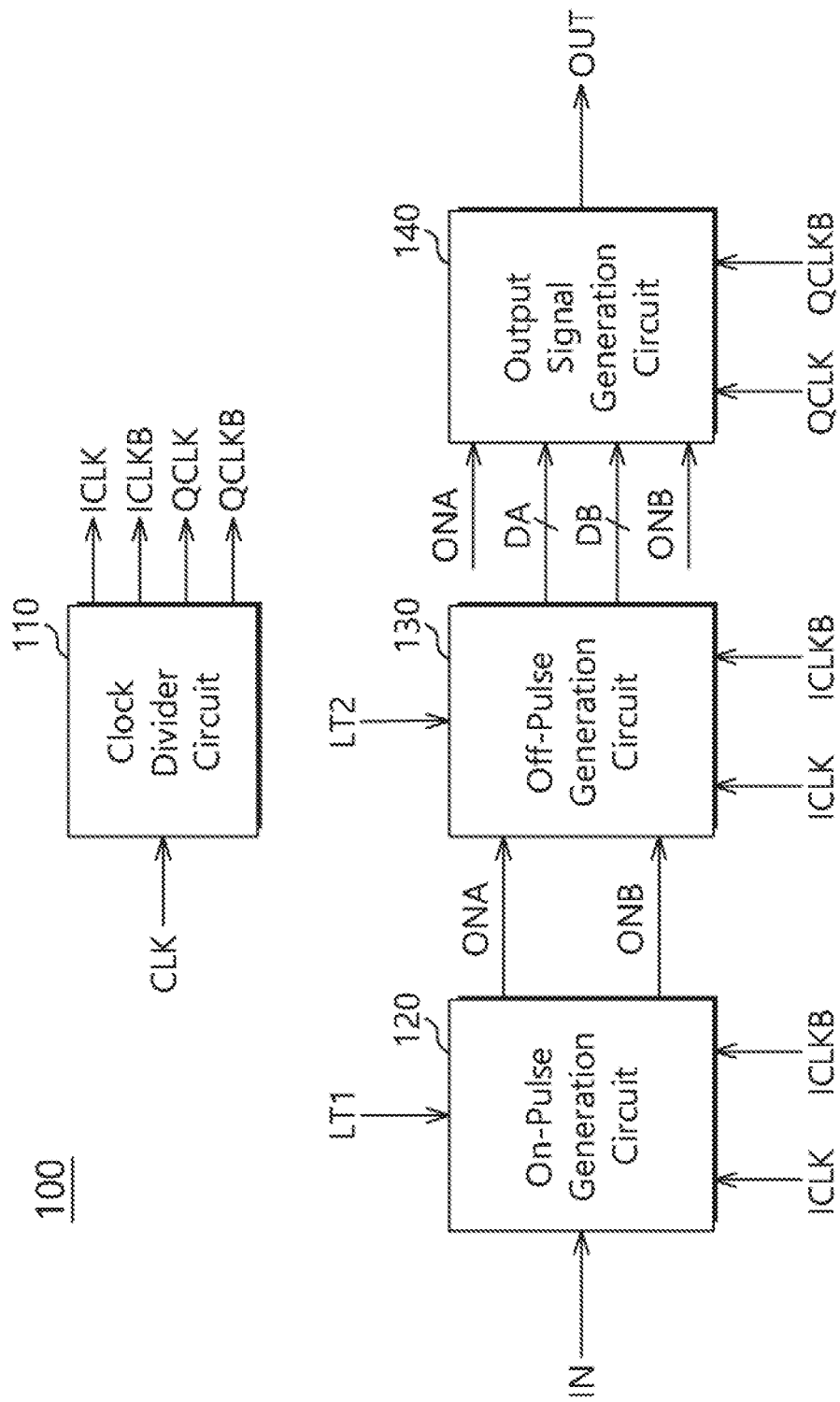
FIG. 1 is a diagram illustrating a configuration of a signal generation circuit in accordance with an embodiment.

FIG. 1 is a diagram illustrating a configuration of a signal generation circuit 100 in accordance with an embodiment. Referring FIG. 1, the signal generation circuit 100 may receive an input signal IN, and generate an output signal OUT which is enabled at a random point of time and has a pulse enabled during a random time. For example, the signal generation circuit 100 may enable the output signal OUT after a first time has elapsed because the input signal IN was inputted, and generate the output signal OUT which is enabled during a second time. The first time may be determined based on first delay information LT1, and the second time may be determined based on the second delay information LT2. The signal generation circuit 100 may delay the input signal IN by the time determined from the first delay information LT1, and enable the output signal OUT based on the delayed signal. The signal generation circuit 100 may retain the enable interval of the output signal OUT during the time determined from second delay information LT2. The signal generation circuit 100 may generate the output signal OUT that is enabled after the time determined from the first delay information has elapsed because the input signal IN was inputted, and has a pulse width that is enabled during the time determined from the second delay information. The times determined from the first delay information LT1 and the second delay information LT2 may correspond to multiples of the period of a clock signal CLK. The signal generation circuit 100 may divide the frequency of the clock signal CLK when the frequency of the clock signal CLK is high, and generate the output signal OUT based on the divided clock signal.

The signal generation circuit 100 may include a clock divider circuit 110, an on-pulse generation circuit 120, an off-pulse generation circuit 130, and an output signal generation circuit 140. The clock divider circuit 110 may receive the clock signal CLK, and generate a plurality of divided clock signals. The clock divider circuit 110 may generate the plurality of divided clock signals by dividing the frequency of the clock signal CLK by m. Here, m may be an integer equal to or more than 2. The plurality of divided clock signals may include a first divided clock signal ICLK, a second divided clock signal ICLKB, a third divided clock signal QCLK, and a fourth divided clock signal QCLKB. The first to fourth divided clock signals ICLK, ICLKB, QCLK, and QCLKB may have a phase difference of 90 degrees therebetween. For example, the clock divider circuit 110 may generate the first to fourth divided clock signals ICLK, ICLKB, QCLK, and QCLKB by dividing the frequency of the clock signal CLK by 2. The first divided clock signal ICLK may have a phase that leads the third divided clock signal QCLK by 90 degrees. The third divided clock signal QCLK may have a phase that leads the second divided clock signal ICLKB by 90 degrees. The second divided clock signal ICLKB may have a phase that leads the fourth divided clock signal QCLKB by 90 degrees. The second divided clock signal ICLKB may be the complementary clock signal of the first divided clock signal ICLK, and the fourth divided clock signal QCLKB may be the complementary clock signal of the third divided clock signal QCLK.

The on-pulse generation circuit 120 may receive the input signal IN, the first delay information LT1, the first divided clock signal ICLK and the second divided clock signal ICLKB. The on-pulse generation circuit 120 may generate an even on-pulse signal ONA and an odd on-pulse signal ONB by delaying the input signal IN in synchronization with the first and second divided clock signals ICLK and ICLKB, based on the first delay information LT1. The on-pulse generation circuit 120 may generate the even on-pulse signal ONA and the odd on-pulse signal ONB by delaying the input signal IN by the time determined from the first delay information LT1 in synchronization with the first and second divided clock signals ICLK and ICLKB. The input signal IN may be inputted in synchronization with the clock signal CLK, and have a pulse width corresponding to one period of the clock signal CLK. Because the first and second divided clock signals ICLK and ICLKB are generated by dividing the clock signal CLK, the input signal IN inputted in synchronization with the clock signal CLK may be synchronized with any one of the first and second divided clock signals ICLK and ICLKB. Therefore, the on-pulse generation circuit 120 may sample the input signal IN based on one of the first and second divided clock signals ICLK and ICLKB. The on-pulse generation circuit 120 may generate one of the even on-pulse signal ONA and the odd on-pulse signal ONB by delaying the sampled signal by the time determined from the first delay information LT1.

The time determined from the first delay information LT1 may correspond to a multiple of the clock signal CLK. The time determined from the first delay information LT1 may correspond to an even or odd multiple of the period of the clock signal CLK. When the input signal IN is inputted in synchronization with the first divided clock signal ICLK and the time determined from the first delay information LT1 corresponds to an even multiple of the period of the clock signal CLK, the on-pulse generation circuit 120 may generate the even on-pulse signal ONA by delaying the input signal IN by the time determined from the first delay information LT1. When the input signal IN is inputted in synchronization with the first divided clock signal ICLK and the time determined from the first delay information LT1 corresponds to an odd multiple of the period of the clock signal CLK, the on-pulse generation circuit 120 may generate the odd on-pulse signal ONB by delaying the input signal IN by the time determined from the first delay information LT1. When the input signal IN is inputted in synchronization with the second divided clock signal ICLKB and the time determined from the first delay information LT1 corresponds to an even multiple of the period of the clock signal CLK, the on-pulse generation circuit 120 may generate the odd on-pulse signal ONB by delaying the input signal IN by the time determined from the first delay information LT1. When the input signal IN is inputted in synchronization with the second divided clock signal ICLKB and the time determined from the first delay information LT1 corresponds to an odd multiple of the period of the clock signal CLK, the on-pulse generation circuit 120 may generate the even on-pulse signal ONA by delaying the input signal IN by the time determined from the first delay information LT1.

The off-pulse generation circuit 130 may receive the even on-pulse signal ONA, the odd on-pulse signal ONB, the second delay information LT2, the first divided clock signal ICLK and the second divided clock signal ICLKB. The off-pulse generation circuit 130 may generate a plurality of delay signals by delaying the even on-pulse signal ONA and the odd on-pulse signal ONB in synchronization with the first divided clock signal ICLK and the second divided clock signal ICLKB, based on the second delay information LT2. The off-pulse generation circuit 130 may generate a plurality of even delay signals DA by sequentially delaying the even on-pulse signal ONA alternately in synchronization with the first divided clock signal ICLK and the second divided clock signal ICLKB, based on the second delay information LT2. The plurality of even delay signals DA may sequentially have a phase difference corresponding to one period of the clock signal CLK. A phase difference between the even on-pulse signal ONA and the even delay signal DA which is finally generated based on the second delay information LT2 may correspond to the time determined from the second delay information LT2.

The off-pulse generation circuit 130 may generate a plurality of odd delay signals DB by sequentially delaying the odd on-pulse signal ONB alternately in synchronization with the second divided clock signal ICLKB and the first divided clock signal ICLK, based on the second delay information LT2. The plurality of odd delay signals DB may sequentially have a phase difference corresponding to one period of the clock signal CLK. A phase difference between the odd on-pulse signal ONB and the odd delay signal DB which is finally generated based on the second delay information LT2 may correspond to the time determined from the second delay information LT2.

The output signal generation circuit 140 may receive the plurality of even delay signals DA, the even on-pulse signal ONA, the plurality of odd delay signals DB, the odd on-pulse signal ONB, the third divided clock signal QCLK, and the fourth divided clock signal QCLKB, and generate the output signal OUT. The output signal generation circuit 140 may generate a first pre-output signal based on the even on-pulse signal ONA and the delay signals delayed in synchronization with the second divided clock signal ICLKB, among the plurality of even delay signals DA and the plurality of odd delay signals DB. The output signal generation circuit 140 may generate the first pre-output signal by summing up the pulses of the even on-pulse signal ONA and the delay signals delayed in synchronization with the second divided clock signal ICLKB. The output signal generation circuit 140 may generate a second pre-output signal based on the odd on-pulse signal ONB and the delay signals delayed in synchronization with the first divided clock signal ICLK, among the plurality of even delay signals DA and the plurality of odd delay signals DB. The output signal generation circuit 140 may generate the second pre-output signal by summing up the pulses of the odd on-pulse signal ONB and the delay signals delayed in synchronization with the first divided clock signal ICLK. The output signal generation circuit 140 may generate the output signal OUT by changing the clock domains of the first and second pre-output signals. The output signal generation circuit 140 may generate the output signal OUT by changing the clock domains of the first and second pre-output signals from the first and second divided clock signals ICLK and ICLKB to the third and fourth divided clock signals QCLK and QCLKB. The output signal generation circuit 140 may generate the output signal OUT based on a signal generated by synchronizing the first pre-output signal with the fourth divided clock signal QCLKB and a signal generated by synchronizing the second pre-output signal with the third divided clock signal QCLK. The first and second pre-output signals will be described below.

Figure 2:
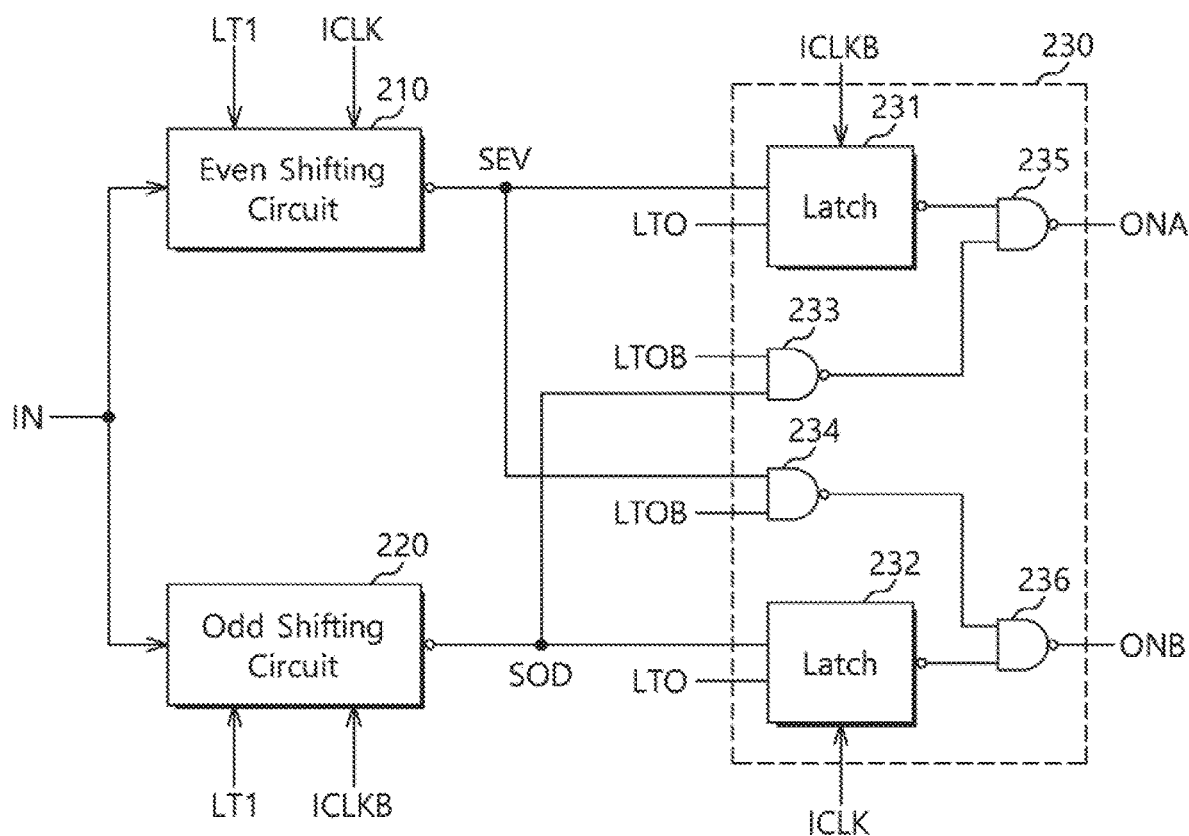
FIG. 2 is a diagram illustrating a configuration of an on-pulse generation circuit illustrated in FIG. 1.

FIG. 2 is a diagram illustrating the configuration of the on-pulse generation circuit 120 illustrated in FIG. 1. Referring to FIG. 2, the on-pulse generation circuit 120 may include an even shifting circuit 210, an odd shifting circuit 220, and a switching circuit 230. The even shifting circuit 210 may receive the input signal IN, the first divided clock signal ICLK, and the first delay information LT1. The even shifting circuit 210 may generate an even synchronization signal SEV by delaying the input signal IN by at least a part of the time determined from the first delay information LT1 in synchronization with the first divided clock signal ICLK. The even shifting circuit 210 may delay the input signal IN in units of two periods of the clock signal CLK and/or one period of the first divided clock signal ICLK. For example, when the time corresponding to the first delay information LT1 is an even multiple of the clock signal CLK, the even shifting circuit 210 may generate the even synchronization signal SEV by delaying the input signal IN by the time corresponding to the first delay information LT1. When the time corresponding to the first delay information LT1 is an odd multiple of the clock signal CLK, the even shifting circuit 210 may generate the even synchronization signal SEV by delaying the input signal IN during a time shorter by one period of the clock signal CLK than the time corresponding to the first delay information LT1. The even shifting circuit 210 may include a plurality of latch circuits configured to sequentially latch the input signal IN in synchronization with rising edges of the first divided clock signal ICLKL. The even shifting circuit 210 may output the even synchronization signal SEV having the opposite level to that of the input signal IN.

The odd shifting circuit 220 may receive the input signal IN, the second divided clock signal ICLKB, and the first delay information LT1. The odd shifting circuit 220 may generate an odd synchronization signal SOD by delaying the input signal IN by at least a part of the time determined from the first delay information LT1 in synchronization with the second divided clock signal ICLKB. The odd shifting circuit 220 may delay the input signal IN in units of two periods of the clock signal CLK and/or one period of the first divided clock signal ICLK. For example, when the time corresponding to the first delay information LT1 is an even multiple of the clock signal CLK, the odd shifting circuit 220 may generate the odd synchronization signal SOD by delaying the input signal IN by the time corresponding to the first delay information LT1. When the time corresponding to the first delay information LT1 is an odd multiple of the clock signal CLK, the odd shifting circuit 220 may generate the odd synchronization signal SOD by delaying the input signal IN during a time shorter by one period of the clock signal CLK than the time corresponding to the first delay information LT1. The odd shifting circuit 220 may include a plurality of latch circuits configured to sequentially latch the input signal IN in synchronization with rising edges of the second divided clock signal ICLKB. The odd shifting circuit 220 may output the odd synchronization signal SOD having the opposite level to that of the input signal IN.

The switching circuit 230 may receive the even synchronization signal SEV, the odd synchronization signal SOD, the first divided clock signal ICLK, and the second divided clock signal ICLKB, and output the even on-pulse signal ONA and the odd on-pulse signal ONB. The switching circuit 230 may output the even synchronization signal SEV as the odd on-pulse signal ONB based on at least a part of the first delay information LT1, and output a delay signal obtained by additionally delaying the even synchronization signal SEV, as the even on-pulse signal ONA. The switching circuit 230 may generate the even on-pulse signal ONA by additionally delaying the even synchronization signal SEV in synchronization with the second divided clock signal ICLKB. The additional delay time may correspond to a time which is not delayed by the even shifting circuit 210, among times corresponding to the first delay information LT1. When the time corresponding to the first delay information LT1 is an even multiple of the clock signal CLK, the switching circuit 230 may output the even synchronization signal SEV as the odd on-pulse signal ONB. When the time corresponding to the first delay information LT1 is an odd multiple of the clock signal CLK, the switching circuit 230 may generate the even on-pulse signal ONA by delaying the even synchronization signal SEV by the time corresponding to one period of the clock signal CLK in synchronization with the second divided clock signal ICLKB.

The switching circuit 230 may output the odd synchronization signal SOD as the even on-pulse signal ONA based on at least a part of the first delay information LT1, and output a delay signal obtained by additionally delaying the odd synchronization signal SOD, as the odd on-pulse signal ONB. The switching circuit 230 may generate the odd on-pulse signal ONB by additionally delaying the odd synchronization signal SOD in synchronization with the first divided clock signal ICLK. The additional delay time may correspond to a time which is not delayed by the odd shifting circuit 220, among the times corresponding to the first delay information LT1. When the time corresponding to the first delay information LT1 is an even multiple of the clock signal CLK, the switching circuit 230 may output the odd synchronization signal SOD as the even on-pulse signal ONA. When the time corresponding to the first delay information LT1 is an odd multiple of the clock signal CLK, the switching circuit 230 may generate the odd on-pulse signal ONB by delaying the odd synchronization signal SOD by the time corresponding to one period of the clock signal CLK in synchronization with the first divided clock signal ICLK.

At least a part of the first delay information LT1 may include information on whether the time corresponding to the first delay information LT1 is an odd or even multiple of the clock signal CLK. At least a part of the first delay information LT1 may be an odd control signal LTO. When the time corresponding to the first delay information LT1 is an odd multiple of the clock signal CLK, the odd control signal LTO may be enabled. When the time corresponding to the first delay information LT1 is an even multiple of the clock signal CLK, the odd control signal LTO may be disabled. When the odd control signal LTO is enabled, the switching circuit 230 may generate the even on-pulse signal ONA by additionally delaying the even synchronization signal SEV or generate the odd on-pulse signal ONB by additionally delaying the odd synchronization signal SOD. When the odd control signal LTO is disabled, the switching circuit 230 may output the odd synchronization signal SOD as the even on-pulse signal ONA or output the even synchronization signal SEV as the odd on-pulse signal ONB.

The switching circuit 230 may include a first latch circuit 231, a second latch circuit 232, a first gate circuit 233, a second gate circuit 234, a third gate circuit 235, and a fourth gate circuit 236. The first latch circuit 231 may receive the even synchronization signal SEV, the second divided clock signal ICLKB and the odd control signal LTO. The first latch circuit 231 may invert and latch the even synchronization signal SEV in synchronization with a rising edge of the second divided clock signal ICLKB, when the odd control signal LTO is enabled. The even synchronization signal SEV may be a signal delayed by the even shifting circuit 210 in synchronization with a rising edge of the first divided clock signal ICLK. Because the first latch circuit 231 latches the even synchronization signal SEV in synchronization with a rising edge of the second divided clock signal ICLKB, the first latch circuit 231 may additionally delay the even synchronization signal SEV by one period of the clock signal CLK. The first latch circuit 231 may be deactivated when the odd control signal LTO is disabled. The second latch circuit 232 may receive the odd synchronization signal SOD, the first divided clock signal ICLK, and the odd control signal LTO. The second latch circuit 232 may invert and latch the odd synchronization signal SOD in synchronization with a rising edge of the first divided clock signal ICLK, when the odd control signal LTO is enabled. The odd synchronization signal SOD may be a signal delayed by the odd shifting circuit 220 in synchronization with a rising edge of the second divided clock signal ICLKB. Because the second latch circuit 232 latches the odd synchronization signal SOD in synchronization with a rising edge of the first divided clock signal ICLK, the second latch circuit 232 may additionally delay the odd synchronization signal SOD by one period of the clock signal CLK. The second latch circuit 232 may be deactivated when the odd control signal LTO is disabled.

The first gate circuit 233 may receive a complementary signal LTOB of the odd control signal and the odd synchronization signal SOD. The first gate circuit 233 may gate the odd synchronization signal SOD as the complementary signal LTOB of the odd control signal. The first gate circuit 233 may generate an output clamped at a logic high level, when the complementary signal LTOB of the odd control signal is disabled. The first gate circuit 233 may invert and output the odd synchronization signal SOD when the complementary signal LTOB of the odd control signal is enabled. The first gate circuit 233 may include a NAND gate. The second gate circuit 234 may receive the complementary signal LTOB of the odd control signal and the even synchronization signal SEV. The second gate circuit 234 may gate the even synchronization signal SEV as the complementary signal LTOB of the odd control signal. The second gate circuit 234 may generate an output clamped at a logic high level, when the complementary signal LTOB of the odd control signal is disabled. The second gate circuit 234 may invert and output the even synchronization signal SEV when the complementary signal LTOB of the odd control signal is enabled. The second gate circuit 234 may include a NAND gate.

The third gate circuit 235 may receive the output of the first latch circuit 231 and the output of the first gate circuit 233. The third gate circuit 235 may output the even on-pulse signal ONA by gating the outputs of the first latch circuit 231 and the first gate circuit 233. When the output of the first gate circuit 233 is clamped at a logic high level, the third gate circuit 235 may invert the output of the first latch circuit 231, and output the inverted signal as the even on-pulse signal ONA. When the first latch circuit 231 is deactivated so that the output of the first latch circuit 231 is clamped at a logic high level, the third gate circuit 235 may invert the output of the first gate circuit 233, and output the inverted signal as the even on-pulse signal ONA. The third gate circuit 235 may include a NAND gate. The fourth gate circuit 236 may receive the output of the second latch circuit 232 and the output of the second gate circuit 234. The fourth gate circuit 236 may output the odd on-pulse signal ONB by gating the outputs of the second latch circuit 232 and the second gate circuit 234. When the output of the second gate circuit 234 is clamped at a logic high level, the fourth gate circuit 236 may invert the output of the second latch circuit 232, and output the inverted signal as the odd on-pulse signal ONB. When the second latch circuit 232 is deactivated so that the output of the second latch circuit 232 is clamped at a logic high level, the fourth gate circuit 236 may invert the output of the second gate circuit 234, and output the inverted signal as the odd on-pulse signal ONB. The fourth gate circuit 236 may include a NAND gate.

Figure 3:
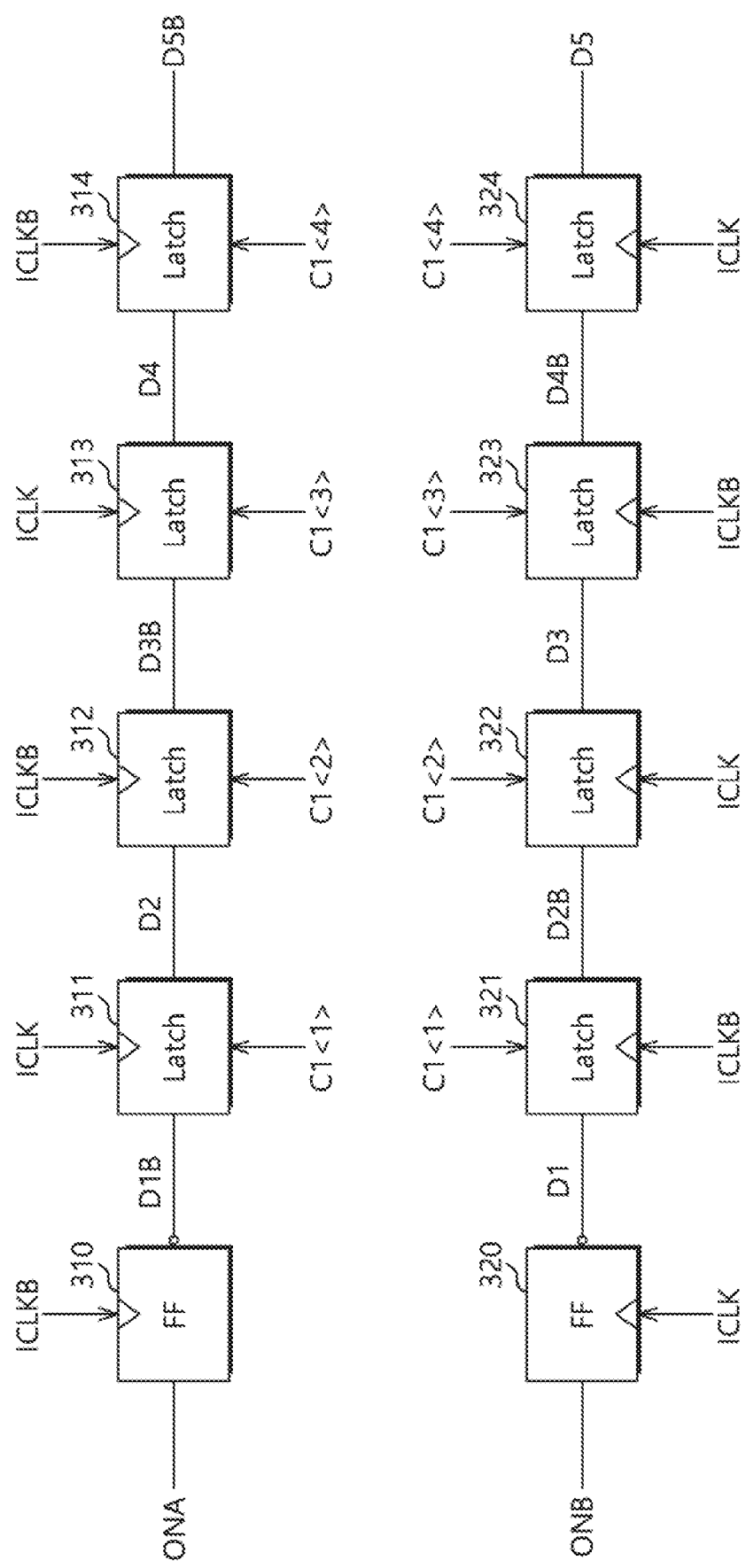
FIG. 3 is a diagram illustrating a configuration of an off-pulse generation circuit illustrated in FIG. 1.

FIG. 3 is a diagram illustrating the configuration of the off-pulse generation circuit 130 illustrated in FIG. 1. Referring to FIG. 3, the off-pulse generation circuit 130 may include a first flip-flop 310, a plurality of even latch circuits 311 to 314, a second flip-flop 320, and a plurality of odd latch circuits 321 to 324. The first flip-flop 310 may receive the even on-pulse signal ONA and the second divided clock signal ICLKB, and output a first delay bar signal D1B. The first flip-flop 310 may generate the first delay bar signal D1B by inverting and delaying the even on-pulse signal ONA in synchronization with the second divided clock signal ICLKB. Because the even on-pulse signal ONA is outputted by the on-pulse generation circuit 120 in synchronization with the second divided clock signal ICLKB, the first delay bar signal D1B may have a phase that lags behind the even on-pulse signal ONA by one period of the second divided clock signal ICLKB.

The plurality of even latch circuits 311 to 314 may receive the first delay bar signal D1B, a delay control signal C1<1: 4>, the first divided clock signal ICLK, and the second divided clock signal ICLKB, and generate an output delay bar signal. The plurality of even latch circuits 311 to 314 may generate the output delay bar signal by delaying the first delay bar signal D1B alternately in synchronization with the first divided clock signal ICLK and the second divided clock signal ICLKB, based on the delay control signal C1<1:4>. The delay control signal C1<1:4> may be generated based on the second delay information LT2. The number of bits contained in the delay control signal C1<1:4> may correspond to the number of latch circuits included in the plurality of even latch circuits. The delay control signal C1<1:4> may be a four-bit signal, for example. The plurality of even latch circuits may include a first even latch circuit 311, a second even latch circuit 312, a third even latch circuit 313, and a fourth even latch circuit 314. When the first bit C1<1> of the delay control signal is at a logic high level, the first even latch circuit 311 may latch the first delay bar signal D1B in synchronization with a rising edge of the first divided clock signal ICLK, and output the latched signal as a second delay signal D2. When the second bit C1<2> of the delay control signal is at a logic high level, the second even latch circuit 312 may latch the second delay signal D2 in synchronization with a rising edge of the second divided clock signal ICLKB, and output the latched signal as a third delay bar signal D3B. When the third bit C1<3> of the delay control signal is at a logic high level, the third even latch circuit 313 may latch the third delay bar signal D3B in synchronization with a rising edge of the first divided clock signal ICLK, and output the latched signal as a fourth delay signal D4. When the fourth bit C1<4> of the delay control signal is at a logic high level, the fourth even latch circuit 314 may latch the fourth delay signal D4 in synchronization with a rising edge of the second divided clock signal ICLKB, and output the latched signal as a fifth delay bar signal D5B. The first delay bar signal D1B, the second delay signal D2, the third delay bar signal D3B, the fourth delay signal D4, and the fifth delay bar signal D5B may correspond to the plurality of even delay signals DA. The signal which is finally generated according to the delay control signal C1<1:4>, among the first delay bar signal D1B, the second delay signal D2, the third delay bar signal D3B, the fourth delay signal D4, and the fifth delay bar signal D5B, may correspond to the output delay bar signal.

The second flip-flop 320 may receive the odd on-pulse signal ONB and the first divided clock signal ICLK, and output a first delay signal D1. The second flip-flop 320 may generate the first delay signal D1 by inverting and delaying the odd on-pulse signal ONB in synchronization with the first divided clock signal ICLK. Because the odd on-pulse signal ONB is outputted by the on-pulse generation circuit 120 in synchronization with the first divided clock signal ICLK, the first delay signal D1 may have a phase that lags behind the odd on-pulse signal ONB by one period of the first divided clock signal ICLK.

The plurality of odd latch circuits 321 to 324 may receive the first delay signal D1, the delay control signal C1<1:4>, the second divided clock signal ICKLB, and the first divided clock signal ICLK, and generate an output delay signal. The plurality of odd latch circuits 321 to 324 may generate the output delay signal by delaying the first delay signal D1 alternately in synchronization with the second divided clock signal ICLKB and the first divided clock signal ICLK, based on the delay control signal C1<1:4>. The plurality of odd latch circuits may include a first odd latch circuit 321, a second odd latch circuit 322, a third odd latch circuit 323, and a fourth odd latch circuit 324. When the first bit C1<1> of the delay control signal is at a logic high level, the first odd latch circuit 321 may latch the first delay signal D1 in synchronization with a rising edge of the second divided clock signal ICLKB, and output the latched signal as a second delay bar signal D2B. When the second bit C1<2> of the delay control signal is at a logic high level, the second odd latch circuit 322 may latch the second delay bar signal D2B in synchronization with a rising edge of the first divided clock signal ICLK, and output the latched signal as a third delay signal D3. When the third bit C1<3> of the delay control signal is at a logic high level, the third odd latch circuit 323 may latch the third delay signal D3 in synchronization with a rising edge of the second divided clock signal ICLKB, and output the latched signal as a fourth delay bar signal D4B. When the fourth bit C1<4> of the delay control signal is at a logic high level, the fourth odd latch circuit 324 may latch the fourth delay bar signal D4B in synchronization with a rising edge of the first divided clock signal ICLK, and output the latched signal as a fifth delay signal D5. The first delay signal D1, the second delay bar signal D2B, the third delay signal D3, the fourth delay bar signal D4B, and the fifth delay signal D5 may correspond to the plurality of odd delay signals DB. The signal which is finally generated according to the delay control signal C1<1:4>, among the first delay signal D1, the second delay bar signal D2B, the third delay signal D3, the fourth delay bar signal D4B, and the fifth delay signal D5, may correspond to the output delay signal.

Figure 4:
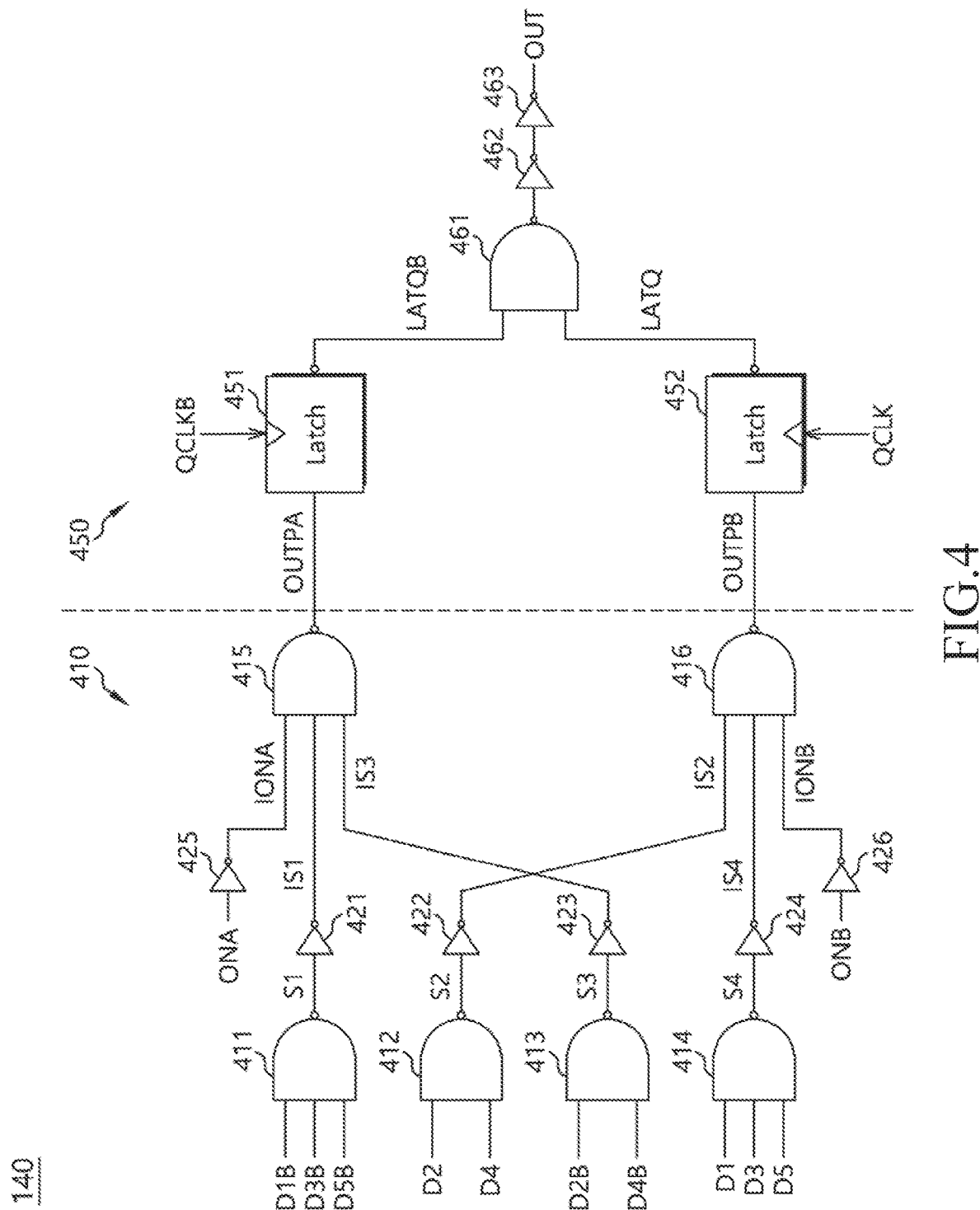
FIG. 4 is a diagram illustrating a configuration of an output signal generation circuit illustrated in FIG. 1.

FIG. 4 is a diagram illustrating the configuration of the output signal generation circuit 140 illustrated in FIG. 1. In FIG. 4, the output signal generation circuit 140 may include a signal summing circuit 410 and a clock domain transformation circuit 450. The signal summing circuit 410 may receive the even on-pulse signal ONA, the odd on-pulse signal ONB, and the plurality of delay signals generated through the off-pulse generation circuit 130. The signal summing circuit 410 may generate a first pre-output signal OUTPA by summing up the even on-pulse signal ONA and the delay signals delayed in synchronization with the second divided clock signal ICLKB, among the plurality of delay signals generated through the off-pulse generation circuit 130. The signal summing circuit 410 may generate a second pre-output signal OUTPB by summing up the odd on-pulse signal ONB and the delay signals delayed in synchronization with the first divided clock signal ICLK, among the plurality of delay signals generated through the off-pulse generation circuit 130.

The clock domain transformation circuit 450 may receive the first and second pre-output signals OUTPA and OUTPB, and generate the output signal OUT by transforming the clock domains of the first and second pre-output signals OUTPA and OUTPB. Because the first and second pre-output signals OUTPA and OUTPB are signals obtained by summing up the signals generated in synchronization with the first and second divided clock signals ICLK and ICKB, respectively, the clock domains of the first and second pre-output signals OUTPA and OUTPB may be the first and second divided clock signals ICLK and ICLKB. The clock domain transformation circuit 450 may receive the third and fourth divided clock signals QCLK and QCLKB, and generate the output signal OUT having the third and fourth divided clock signals QCLK and QCLKB as clock domains by transforming the clock domains of the first and second pre-output signals OUTPA and OUTPB. The clock domain transformation circuit 450 may latch the first pre-output signal OUTPA in synchronization with the fourth divided clock signal QCLKB. The clock domain transformation circuit 450 may latch the second pre-output signal OUTPB in synchronization with the third divided clock signal QCLK. The clock domain transformation circuit 450 may generate the output signal OUT by summing up the signals latched in synchronization with the third and fourth divided clock signals QCLK and QCLKB.

The signal summing circuit 410 may include a first NAND gate 411, a second NAND gate 412, a third NAND gate 413, a fourth NAND gate 414, a first inverter 421, a second inverter 422, a third inverter 423, a fourth inverter 434, a fifth inverter 425, a sixth inverter 426, and a fifth NAND gate 415 and a sixth NAND gate 416. Referring to FIG. 4 with FIG. 3, the first NAND gate 411 may receive the delay signals delayed in synchronization with the second divided clock signal ICLKB, among the delayed delay signals, from the first flip-flop 310 and the plurality of even latch circuits 311 to 314. The first NAND gate 411 may receive the first delay bar signal D1B, the third delay bar signal D3B and the fifth delay bar signal D5B. The second NAND gate 412 may receive the delay signals delayed in synchronization with the first divided clock signal ICLK, among the delayed delay signals, from the first flip-flop 310 and the plurality of even latch circuits 311 to 314. The second NAND gate 412 may receive the second delay signal D2 and the fourth delay signal D4. The third NAND gate 413 may receive the delay signals delayed in synchronization with the second divided clock signal ICLKB, among the delayed delay signals, from the second flip-flop 320 and the plurality of odd latch circuits 321 to 324. The third NAND gate 413 may receive the second delay bar signal D2B and the fourth delay bar signal D4B. The fourth NAND gate 414 may receive the delay signals delayed in synchronization with the first divided clock signal ICLK, among the delayed delay signals, from the second flip-flop 320 and the plurality of odd latch circuits 321 to 324. The fourth NAND gate 414 may receive the first delay signal D1, the third delay signal D3 and the fifth delay signal D5. Each of the first to fifth delay signals D1, D2, D3, D4, and D5 and the first to fifth delay bar signals D1B, D2B, D3B, D4B, and D5B may have a pulse that is enabled to a low level. The first NAND gate 411 may generate a first sum signal S1 having a pulse enabled to a high level by summing up the pulse widths of the first delay bar signal D1B, the third delay bar signal D3B and the fifth delay bar signal D5B. The second NAND gate 412 may generate a second sum signal S2 having a pulse enabled to a high level by summing up the pulse widths of the second and fourth delay signals D2 and D4. The third NAND gate 413 may generate a third sum signal S3 having a pulse enabled to a high level by summing up the pulse widths of the second and fourth delay bar signals D2B and D4B. The fourth NAND gate 414 may generate a fourth sum signal S4 having a pulse enabled to a high level by summing up the pulse widths of the first delay signal D1, the third delay signal D3, and the fifth delay signal D5.

The first inverter 421 may invert the first sum signal S1 and output the inverted first sum signal IS1. The second inverter 422 may invert the second sum signal S2 and output an inverted second sum signal IS2. The third inverter 423 may invert the third sum signal S3 and output an inverted third sum signal IS3. The fourth inverter 424 may invert the fourth sum signal S4 and output the inverted fourth sum signal IS4. The fifth inverter 425 may invert the even on-pulse signal ONA and output an inverted even on-pulse signal IONA. The sixth inverter 426 may invert the odd on-pulse signal ONB and output an inverted odd on-pulse signal IONB.

The fifth NAND gate 415 may receive the inverted even on-pulse signal IONA, the inverted first sum signal IS1, and the inverted third sum signal IS3. The fifth NAND gate 415 may sum up the pulse widths of the inverted even on-pulse signal IONA, the inverted first sum signal IS1, and the inverted third sum signal IS3, and output the first pre-output signal OUTPA. The first pre-output signal OUTPA may have a pulse width that is retained from a point of time that the even on-pulse signal ONA is enabled to a point of time that the delay bar signal which is finally generated according to the second delay information LT2 and/or the delay control signal C1<1:4>, among the first to fifth delay bar signals D1B to D5B, is disabled. The sixth NAND gate 416 may receive the inverted odd on-pulse signal IONB, the inverted second sum signal IS2 and the inverted fourth sum signal IS4. The sixth NAND gate 416 may sum up the pulse widths of the inverted odd on-pulse signal IONB, the inverted second sum signal IS2, and the inverted fourth sum signal IS4, and output the second pre-output signal OUTPB. The second pre-output signal OUTPB may have a pulse width that is retained from a point of time that the odd on-pulse signal ONB is enabled to a point of time that the delay signal which is finally generated according to the second delay information LT2 and/or the delay control signal C1<1:4>, among the first to fifth delay bar signals D1B to D5B, is disabled.

The clock domain transformation circuit 450 may include a first latch circuit 451, a second latch circuit 452, a seventh NAND gate 461, a seventh inverter 462, and an eighth inverter 463. The first latch circuit 451 may receive the first pre-output signal OUTPA and the fourth divided clock signal QCLKB. The first latch circuit 451 may invert and latch the first pre-output signal OUTPA in synchronization with a rising edge of the fourth divided clock signal QCLKB, and output a latched signal LATQB. The second latch circuit 452 may receive the second pre-output signal OUTPB and the third divided clock signal QCLK. The second latch circuit 452 may invert and latch the second pre-output signal OUTPB in synchronization with a rising edge of the third divided clock signal QCLK, and output a latched signal LATQ. The seventh NAND gate 461 may receive the latched signals LATQB and LATQ from the first and second latch circuits 451 and 452. The seventh inverter 462 may receive an output of the seventh NAND gate 461, invert the output of the seventh NAND gate 461, and output the inverted signal. The eighth inverter 463 may receive the output of the seventh inverter 462, invert the output of the seventh inverter 462, and output the inverted signal as the output signal OUT. In the present embodiment, the seventh NAND gate 461 may be a symmetric NAND gate. The seventh NAND gate 461 may be configured as a symmetric NAND gate to generate the output signal OUT under the same delay condition regardless of the pulse widths of the latched signals LATQB and LATQ.

Figure 5:
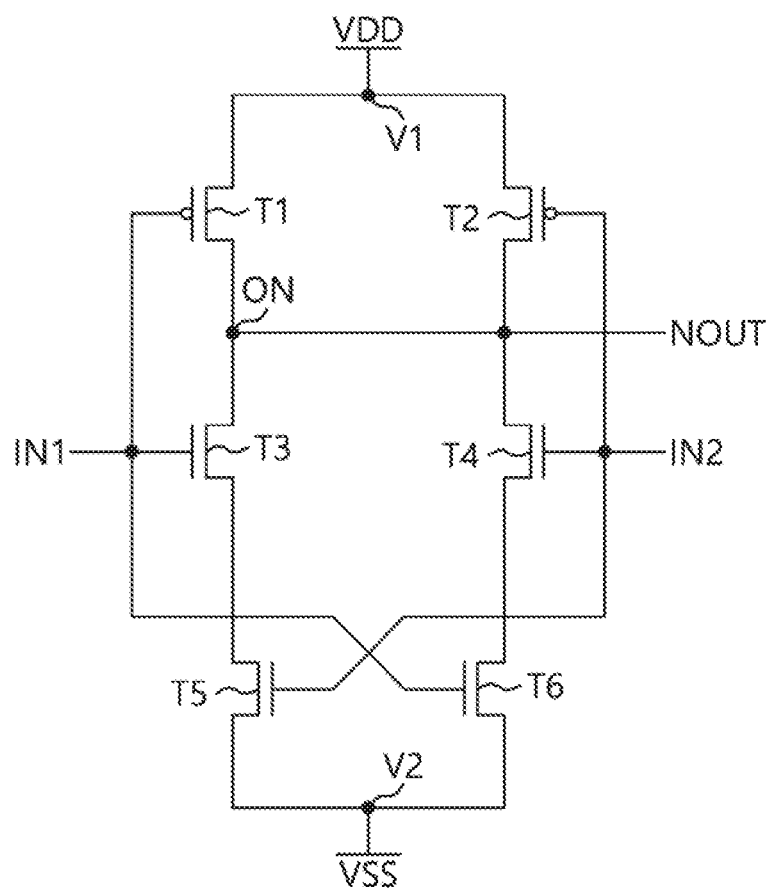
FIG. 5 is a diagram illustrating a configuration of a symmetric NAND gate in accordance with an embodiment.

FIG. 5 is a diagram illustrating the configuration of a symmetric NAND gate 500 in accordance with an embodiment. In FIG. 5, the symmetric NAND gate 500 may be applied as the seventh NAND gate 461 illustrated in FIG. 4. The symmetric NAND gate 500 may include a first transistor T1, a second transistor T2, a third transistor T3, a fourth transistor T4, a fifth transistor T5, and a sixth transistor T6. The first and second transistors T1 and T2 may be P-channel MOS transistors, and the third to sixth transistors T3 to T6 may be N-channel MOS transistors. The first transistor T1 may be coupled between a first supply voltage terminal V1 and an output node ON, and receive a first input signal IN1 through a gate thereof. An output signal NOUT may be outputted through the output node ON. A first supply voltage VDD may be supplied to the symmetric NAND gate 500 through the first supply voltage terminal V1. The second transistor T2 may be coupled between the first supply voltage terminal V1 and the output node ON, and receive a second input signal IN2 through a gate thereof. The third transistor T3 may have one terminal coupled to the output node ON, and receive the first input signal IN1 through a gate thereof. The fourth transistor T4 may have one terminal coupled to the output node ON, and receive the second input signal IN2 through a gate thereof. The fifth transistor T5 may be coupled between the other terminal of the third transistor T3 and a second supply voltage terminal V2, and receive the second input signal IN2 through a gate thereof. A second supply voltage VSS may be supplied to the symmetric NAND gate 500 through the second supply voltage terminal V2. The second supply voltage VSS may have a lower voltage level than the first supply voltage VDD. The first supply voltage VDD may have a sufficiently high voltage level such that the output signal NOUT can be determined to be a logic high level. The second supply voltage VSS may have a sufficiently low voltage level such that the output signal NOUT can be determined to be a logic low level. The sixth transistor T6 may be coupled between the other terminal of the fourth transistor T4 and a second supply voltage terminal V2, and receive the first input signal IN1 through a gate thereof. When the symmetric NAND gate 500 is applied as the seventh NAND gate 461 illustrated in FIG. 4, the first input signal IN1 may correspond to the signal LATQB latched in synchronization with the fourth divided clock signal QCLKB, and the second input signal IN2 may correspond to the signal LATQ latched in synchronization with the third divided clock signal QCLK. The output signal NOUT may correspond to the output of the seventh NAND gate 461.

When the first and second input signals IN1 and IN2 are all at a logic low level, the first and second transistors T1 and T2 may be turned on, and the third to sixth transistors T3 to T6 may be turned off. The output node ON may be driven with the first supply voltage VDD through the first and second transistors T1 and T2, and the output signal NOUT having a logic high level may be generated through the output node ON. When the first input signal IN1 is at a logic high level and the second input signal IN2 is at a logic low level, the second transistor T2, the third transistor T3, and the sixth transistor T6 may be turned on, and the first transistor T1, the fourth transistor T4, and the fifth transistor T5 may be turned off. The output node ON may be driven with the first supply voltage VDD through the second transistor T2, and the output signal NOUT having a logic high level may be generated through the output node ON. When the first input signal IN1 is at a logic low level and the second input signal IN2 is at a logic high level, the first transistor T1, the fourth transistor T4, and the fifth transistor T5 may be turned on, and the second transistor T2, the third transistor T3, and the sixth transistor T6 may be turned off. The output node ON may be driven with the first supply voltage VDD through the first transistor T1, and the output signal NOUT having a logic high level may be generated through the output node ON. When the first and second input signals IN1 and IN2 are all at a high level, the first and second transistors T1 and T2 may be turned off, and the third to sixth transistors T3 to T6 may be turned on. The output node ON may be driven with the second supply voltage VSS through the third to sixth transistors T3 to T6, and the output signal NOUT having a logic low level may be generated through the output node ON. FIG. 5 illustrates the symmetric NAND gate 500 as a NAND gate with a 2-input 1-output structure, but the symmetric NAND gate 500 may be modified to receive three or more input signals and perform a NAND operation.

Figure 6A:
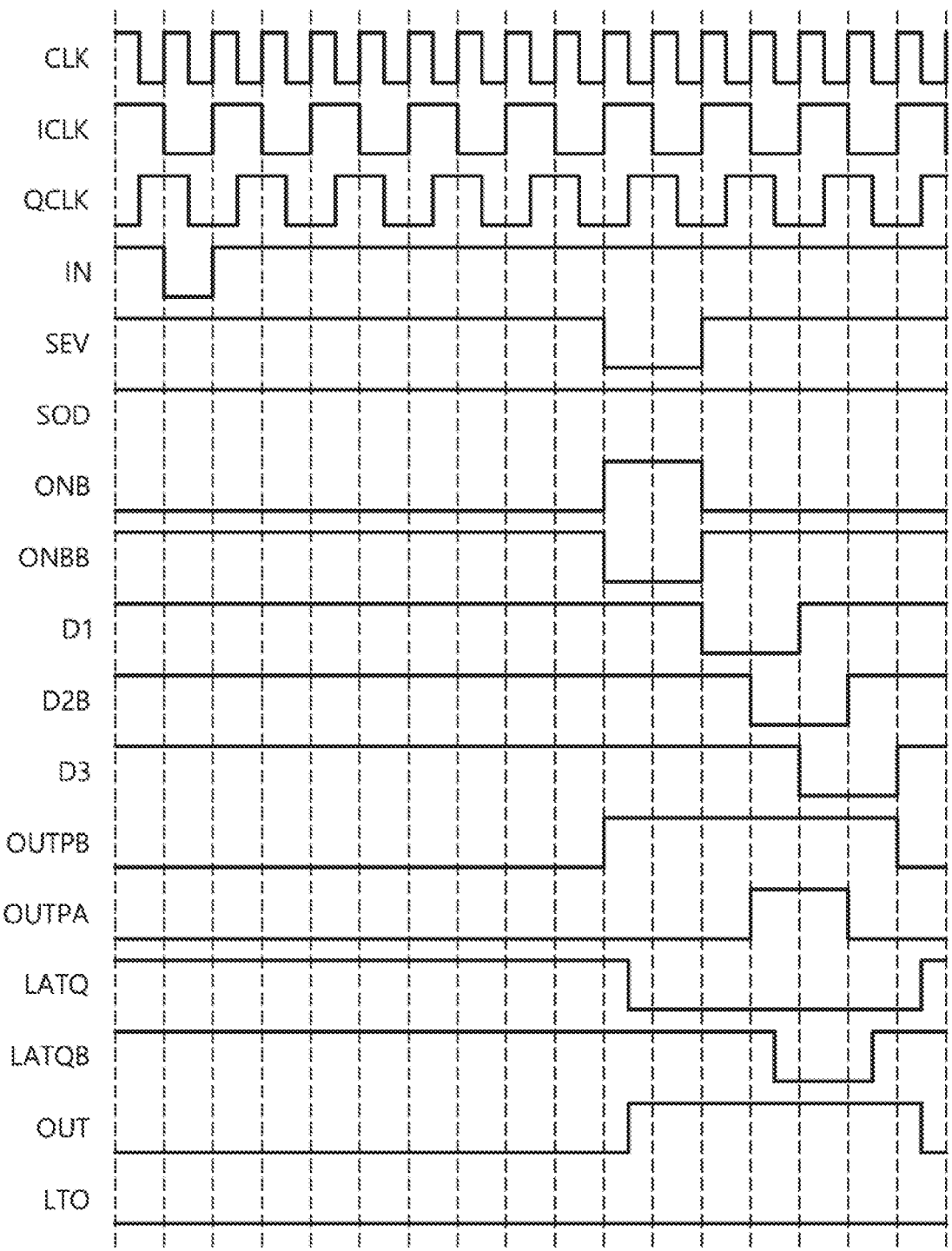
FIGS. 6A and 6B are timing diagrams illustrating an operation of the signal generation circuit in accordance with the present embodiment.
Figure 6B:
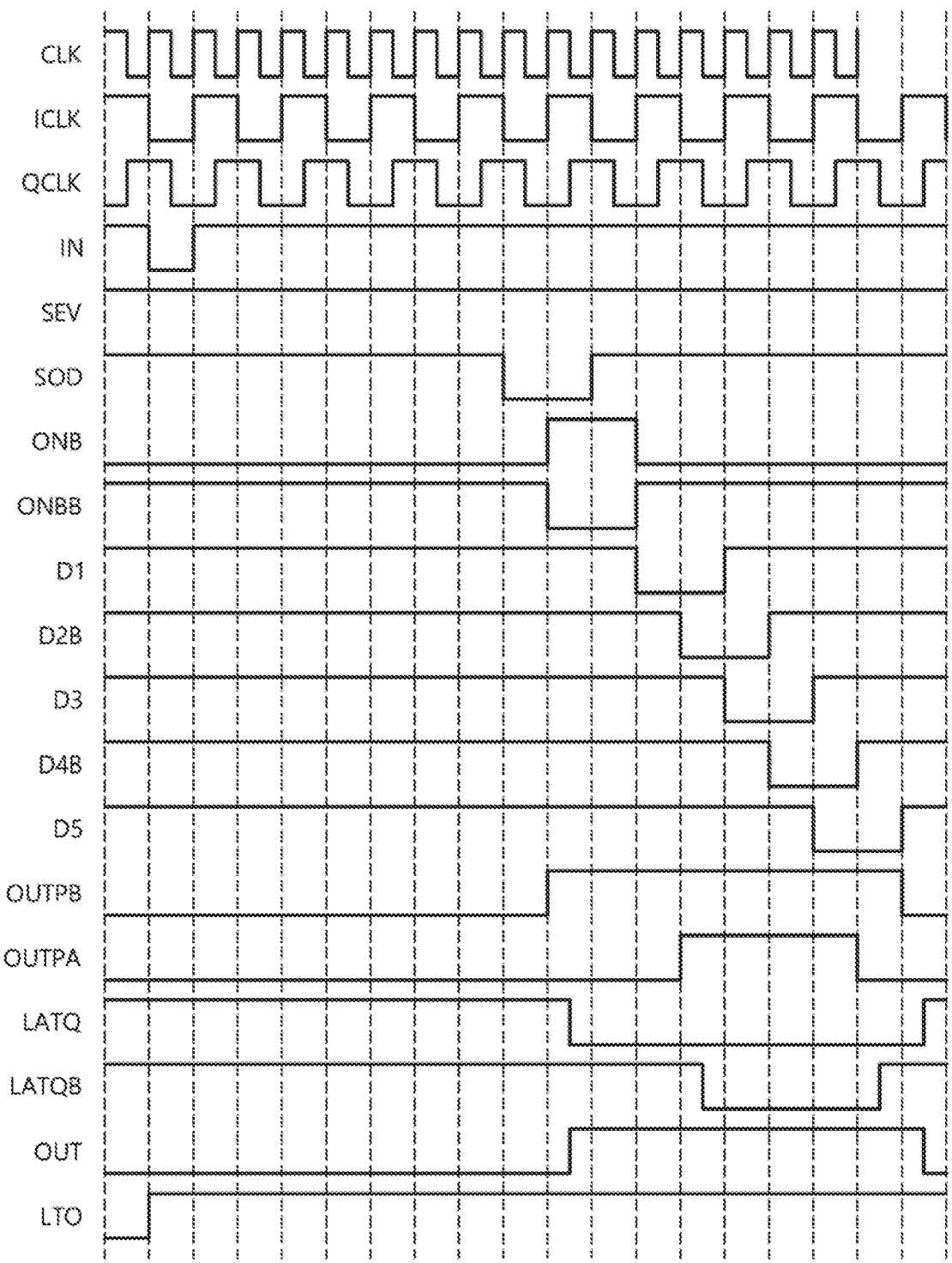

FIGS. 6A and 6B are timing diagrams illustrating an operation of the signal generation circuit 100 in accordance with the embodiment. Referring to FIGS. 1 to 5 and FIGS. 6A and 6B, the operation of the signal generation circuit 100 in accordance with the present embodiment will be described as follows. FIG. 6A illustrates the case in which the first delay information LT1 is 8, and the second delay information LT2 is 6. When the first delay information LT1 is 8, it may indicate that the time determined from the first delay information LT1 corresponds to eight periods of the clock signal CLK. When the second delay information LT2 is 6, it may indicate that the time determined from the second delay information LT2 corresponds to six periods of the clock signal CLK. When the second delay information is 6, the first and second bits C1<1> and C1<2> of the delay control signal may be enabled to a logic high level. The input signal IN may be enabled to a logic low level during one period of the clock signal, and inputted to the on-pulse generation circuit 120 in synchronization with a rising edge of the first divided clock signal ICLK. Because the time determined from the first delay information LT1 is an even multiple of the period of the clock signal CLK, the even shifting circuit 210 may generate the even synchronization signal SEV by delaying the input signal IN in synchronization with the first divided clock signal ICLK during a time corresponding to the first delay information LT1. The even shifting circuit 210 may sequentially delay the input signal IN four times at rising edges of the first divided clock signal ICLK, and the pulse width of the even synchronization signal SEV may correspond to one period of the first divided clock signal ICLK. The odd control signal LTO may be retained in a disabled state, the first latch circuit 231 of the switching circuit 230 may be deactivated, and the first gate circuit 233 of the switching circuit 230 may output the even synchronization signal SEV to the fourth gate circuit 236. The fourth gate circuit 236 may generate the odd on-pulse signal ONB by inverting the output of the first gate circuit 233. Because the input signal IN is inverted through the even shifting circuit 210, the first gate circuit 233, and the fourth gate circuit 236, the odd on-pulse signal ONB may include a pulse which is enabled to a logic high level. The odd on-pulse signal ONB may be enabled after eight periods of the clock signal CLK and/or four periods of the first divided clock signal ICLK, corresponding to the first delay information LT1, have passed because the input signal IN was enabled.

Because the first and second bits C1<1> and C1<2> of the delay control signal are at a logic high level, the second flip-flop 320 of the off-pulse generation circuit 130 may invert and delay the odd on-pulse signal ONB in synchronization with the first divided clock signal ICLK and output the first delay signal D1, and the first and second odd latch circuits 321 and 322 may generate the second delay bar signal D2B and the third delay signal d3, respectively, by sequentially delaying the first delay signal D1 in synchronization with rising edges of the second divided clock signal ICLKB and the first divided clock signal ICLK.

The third NAND gate 413 of the signal summing circuit 410 may output the second delay bar signal D2B as the third sum signal S3, and the fourth NAND gate 414 may sum up the pulse widths of the first and third delay signals D1 and D3 and output the fourth sum signal S4. The fifth NAND gate 415 may invert the inverted third sum signal IS3, and output the inverted signal as the first pre-output signal OUTPA. The sixth NAND gate 416 may sum up the pulse widths of the inverted odd on-pulse signal ONB and the inverted fourth sum signal IS4, and output the second pre-output signal OUTPB. The first latch circuit 451 of the clock domain transformation circuit 450 may invert and latch the first pre-output signal OUTPA in synchronization with a rising edge of the fourth divided clock signal QCLKB (i.e. a falling edge of the third divided clock signal QCLK), and output the latched signal LATQB. The second latch circuit 452 may invert and latch the second pre-output signal OUTPB in synchronization with a rising edge of the third divided clock signal QCLK, and output the latched signal LATQ. The pulse widths of the latched signals LATQB and LATQ may be summed up by the seventh NAND gate 461, and an output of the seventh NAND gate 461 may be sequentially inverted through the seventh and eighth inverters 462 and 463. Therefore, the output signal OUT may be generated, which has a pulse that is enabled to a logic low level during a time corresponding to six periods of the clock signal CLK and/or three periods of the third divided clock signal ICLK.

FIG. 6B illustrates the case in which the first delay information LT1 is 9 and the second delay information LT2 is 8. When the first delay information LT1 is 9, it may indicate that the time determined from the first delay information LT1 corresponds to nine periods of the clock signal CLK. When the second delay information LT2 is 8, it may indicate that the time determined from the second delay information LT2 corresponds to eight periods of the clock signal CLK. When the second delay information is 8, the first to fourth bits C1<1:4> of the delay control signal may be all enabled to a logic high level. The input signal IN may be inputted to the on-pulse generation circuit 120 in synchronization with a rising edge of the second divided clock signal ICLKB (i.e. a falling edge of the first divided clock signal ICLK). Because the time determined from the first delay information LT1 is an odd multiple of the period of the clock signal CLK, the odd shifting circuit 220 may generate the odd synchronization signal SOD by delaying the input signal IN in synchronization with the second divided clock signal ICLKB during a time corresponding to eight periods of the clock signal CLK as a part of the time corresponding to the first delay information LT1. The odd shifting circuit 220 may sequentially delay the input signal IN four times at rising edges of the second divided clock signal ICLKB, and the pulse width of the odd synchronization signal SOD may correspond to one period of the second divided clock signal ICLKB. The odd control signal LTO may be enabled, and the second latch circuit 232 of the switching circuit 230 may be activated. The second latch circuit 232 may further delay the odd synchronization signal SOD by one period of the clock signal CLK in synchronization with a rising edge of the first divided clock signal ICLK. The fourth gate circuit 236 may generate the odd on-pulse signal ONB by inverting the output of the second latch circuit 232. Because the input signal IN is inverted through the odd shifting circuit 220, the second latch circuit 232, and the fourth gate circuit 236, the odd on-pulse signal ONB may include a pulse that is enabled to a logic high level. The odd on-pulse signal ONB may be enabled after nine periods of the clock signal CLK, corresponding to the first delay information LT1, have passed because the input signal IN was enabled.

Because the first to fourth bits C1<1:4> of the delay control signal are all at a logic high level, the second flip-flop 320 of the off-pulse generation circuit 130 may invert and delay the odd on-pulse signal ONB in synchronization with the first divided clock signal ICLK and output the first delay signal D1, and the first odd latch circuit 321 may delay the first delay signal D1 in synchronization with a rising edge of the second divided clock signal ICLKB and output the second delay bar signal D2B. The second odd latch circuit 322 may delay the second delay bar signal D2B in synchronization with a rising edge of the first divided clock signal ICLK, and output the third delay signal D3. The third odd latch circuit 323 may delay the third delay signal D3 in synchronization with a rising edge of the second divided clock signal ICLKB, and output the fourth delay bar signal D4B. The fourth odd latch circuit 324 may delay the fourth delay bar signal D4B in synchronization with a rising edge of the first divided clock signal ICLK, and output the fifth delay signal D5.

The third NAND gate 413 of the signal summing circuit 410 may sum up the pulse widths of the second delay bar signal D2B and the fourth delay bar signal D4B, and output the third sum signal S3, and the fourth NAND gate 414 may sum up the pulse widths of the first delay signal D1, the third delay signal D3, and the fifth delay signal D5, and output the fourth sum signal S4. The fifth NAND gate 415 may invert the inverted third sum signal IS3, and output the inverted signal as the first pre-output signal OUTPA. The sixth NAND gate 416 may sum up the pulse widths of the inverted odd on-pulse signal IONB and the inverted fourth sum signal IS4, and output the second pre-output signal OUTPB. The first latch circuit 451 of the clock domain transformation circuit 450 may invert and latch the first pre-output signal OUTPA in synchronization with a rising edge of the fourth divided clock signal QCLKB (i.e. a falling edge of the third divided clock signal QCLK), and output the latched signal LATQB. The second latch circuit 452 may invert and latch the second pre-output signal OUTPB in synchronization with a rising edge of the third divided clock signal QCLK, and output the latched signal LATQ. The pulse widths of the latched signals LATQB and LATQ may be summed up by the seventh NAND gate 461, and an output of the seventh NAND gate 461 may be sequentially inverted through the seventh and eighth inverters 462 and 463. Therefore, the output signal OUT may be generated, which has a pulse that is enabled to a logic low level during a time corresponding to eight periods of the clock signal CLK and/or four periods of the third divided clock signal QCLK.

Figure 7:
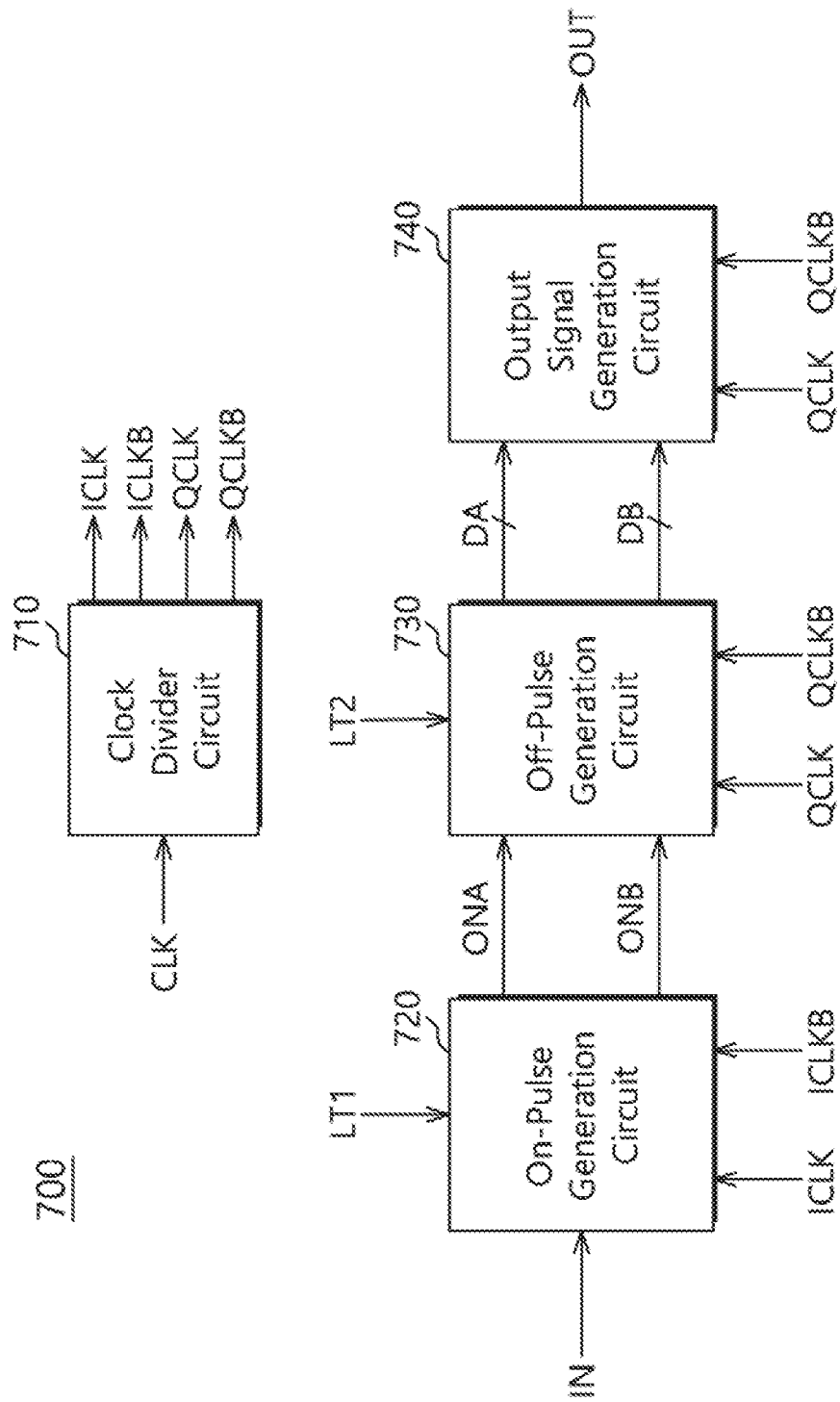
FIG. 7 is a diagram illustrating a configuration of a signal generation circuit in accordance with an embodiment.

FIG. 7 is a diagram illustrating a configuration of a signal generation circuit 700 in accordance with an embodiment. Referring to FIG. 7, the signal generation circuit 700 may include a clock divider circuit 710, an on-pulse generation circuit 720, an off-pulse generation circuit 730, and an output signal generation circuit 740. The clock divider circuit 710 may receive a clock signal CLK, and generate a first divided clock signal ICLK, a second divided clock signal ICLKB, a third divided clock signal QCLK, and a fourth divided clock signal QCLKB. The on-pulse generation circuit 720 may receive an input signal IN, the first divided clock signal ICLK, the second divided clock signal ICLKB, and first delay information LT1, and generate an even on-pulse signal ONA and an odd on-pulse signal ONB. The clock divider circuit 710 and the on-pulse generation circuit 720 may have substantially the same configuration as the clock divider circuit 110 and the on-pulse generation circuit 120 in FIG. 1, and perform the same function as the clock divider circuit 110 and the on-pulse generation circuit 120. Repeated descriptions of the same components will be omitted herein.

The off-pulse generation circuit 730 may receive the even on-pulse signal ONA, the odd on-pulse signal ONB, second delay information LT2, the third divided clock signal QCLK, and the fourth divided clock signal QCLKB. The off-pulse generation circuit 730 may generate a plurality of delay signals by delaying the even on-pulse signal ONA and the odd on-pulse signal ONB in synchronization with the third and fourth divided clock signals QCLK and QCLKB, based on the second delay information LT2. The off-pulse generation circuit 730 may generate a plurality of even delay signals DA by sequentially delaying the even on-pulse signal ONA alternately in synchronization with the third and fourth divided clock signals QCLK and QCLKB, based on the second delay information LT2. The plurality of even delay signals DA may sequentially have a phase difference corresponding to one period of the clock signal CLK. The off-pulse generation circuit 730 may generate a plurality of odd delay signals DB by sequentially delaying the odd on-pulse signal ONB alternately in synchronization with the fourth divided clock signal QCLKB and the third divided clock signal QCLK, based on the second delay information LT2. The plurality of odd delay signals DB may sequentially have a phase difference corresponding to one period of the clock signal CLK. The off-pulse generation circuit 730 may perform a clock domain transformation operation. Because the even on-pulse signal ONA and the odd on-pulse signal ONB are generated by the on-pulse generation circuit 720 in synchronization with the first and second divided clock signals ICLK and ICLKB, the clock domains of the even on-pulse signal ONA and the odd on-pulse signal ONB may be the first and second divided clock signals ICLK and ICLKB. The off-pulse generation circuit 730 may generate the plurality of even delay signals DA and the plurality of odd delay signals DB by transforming the clock domains of the even on-pulse signal ONA and the odd on-pulse signal ONB. Because the plurality of even delay signals DA and the plurality of odd delay signals DB are delayed in synchronization with the third and fourth divided clock signals QCLK and QCLKB, the clock domains of the plurality of even delay signals DA and the plurality of odd delay signals DB may be transformed into the third and fourth divided clock signals QCLK and QCLKB.

The output signal generation circuit 740 may receive the plurality of even delay signals DA, the plurality of odd delay signals DB, the third divided clock signal QCLK, and the fourth divided clock signal QCLKB, and generate the output signal OUT. The output signal generation circuit 740 may generate a first pre-output signal based on the delay signals delayed in synchronization with the third divided clock signal QCLK among the plurality of even delay signals DA and the plurality of odd delay signals DB. The output signal generation circuit 740 may generate the first pre-output signal by summing up the pulse widths of the delay signals delayed in synchronization with the third divided clock signal QCLK. The output signal generation circuit 740 may generate a second pre-output signal based on the delay signals delayed in synchronization with the fourth divided clock signal QCLKB among the plurality of even delay signals DA and the plurality of odd delay signals DB. The output signal generation circuit 740 may generate the second pre-output signal by summing up the pulse widths of the delay signals delayed in synchronization with the fourth divided clock signal QCLKB. The output signal generation circuit 740 may generate the output signal OUT by retiming the first and second pre-output signals based on the third and fourth divided clock signals QCLK and QCLKB, respectively. The output signal generation circuit 740 may retime the first pre-output signal based on the third divided clock signal QCLK. The output signal generation circuit 740 may retime the second pre-output signal based on the fourth divided clock signal QCLKB. The output signal generation circuit 740 may generate the output signal OUT by summing up the retimed signals.

Figure 8:
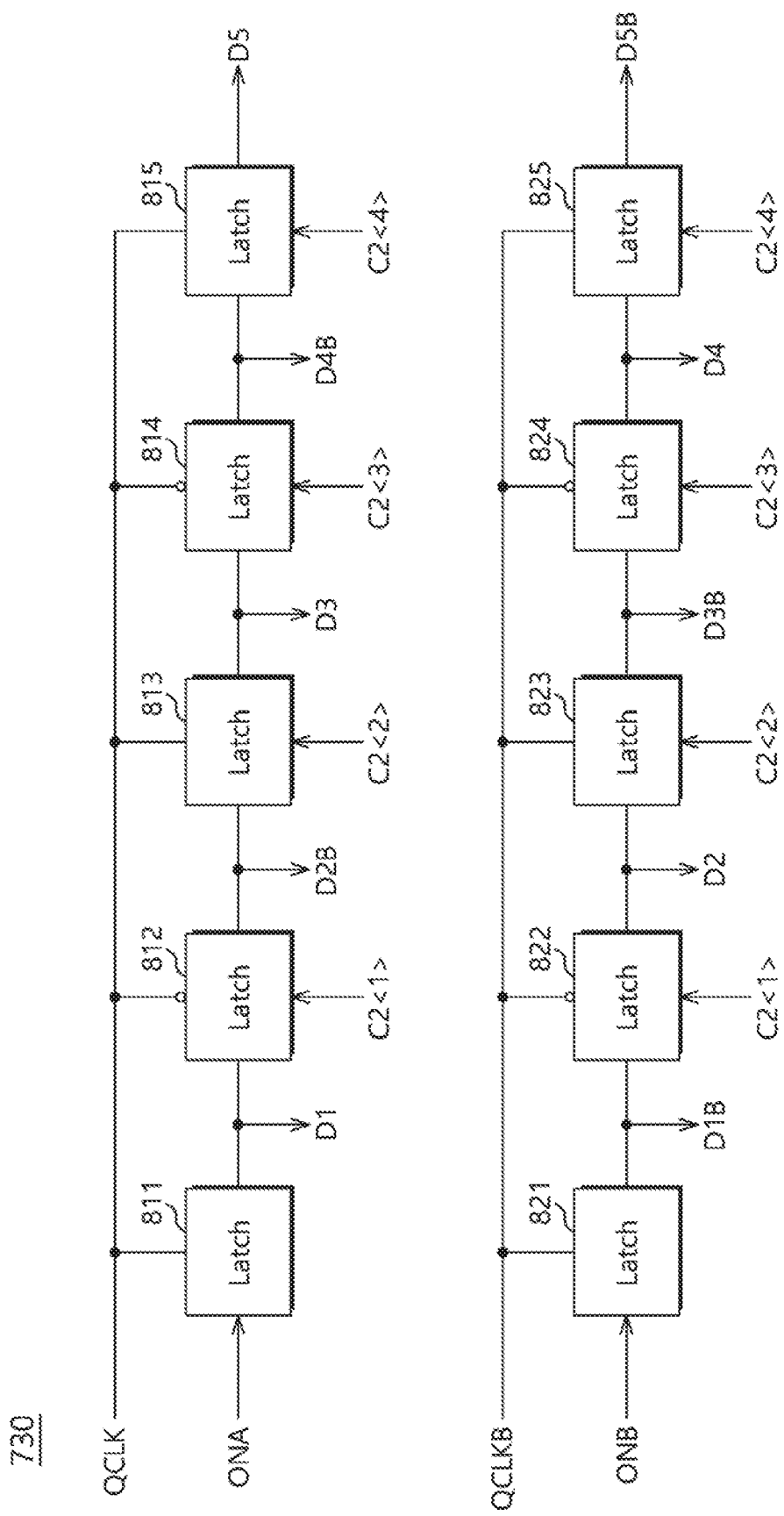
FIG. 8 is a diagram illustrating a configuration of an off-pulse generation circuit illustrated in FIG. 7.

FIG. 8 is a diagram illustrating the configuration of the off-pulse generation circuit 730 illustrated in FIG. 7. Referring to FIG. 8, the off-pulse generation circuit 730 may include a plurality of even latch circuits and a plurality of odd latch circuits. The plurality of even latch circuits may receive the even on-pulse signal ONA, a delay control signal C2<1:4>, the third divided clock signal QCLK, and the fourth divided clock signal QCLKB, and generate an output delay signal. The delay control signal C2<1:4> may be generated based on the second delay information LT2. The number of bits contained in the delay control signal C2<1:4> may correspond to the number of latch circuits included in the plurality of even latch circuits or the plurality of odd latch circuits. For example, the bit number of the delay control signal C2<1:4> may be less by one than the number of latch circuits included in the plurality of even latch circuits or the plurality of odd latch circuits. FIG. 8 illustrates that the plurality of even latch circuits and the plurality of odd latch circuits include five latch circuits, respectively. However, the plurality of even latch circuits and the plurality of odd latch circuits may include less than five latch circuits or more than five latch circuits. The bit number of the delay control signal C2<1:4> may be less than or greater than four.

The plurality of even latch circuits may generate the output delay signal by delaying the even on-pulse signal ONA alternately in synchronization with the third divided clock signal QCLK and the fourth divided clock signal QCLKB, based on the delay control signal C2<1:4>. In FIG.

8, the plurality of even latch circuits may include first to fifth even latch circuits 811 to 815. The first even latch circuit 811 may latch the even on-pulse signal ONA in synchronization with a rising edge of the third divided clock signal QCLK, and output the latched signal as a first delay signal D1. When the first bit C2<1> of the delay control signal is at a logic high level, the second even latch circuit 812 may latch the first delay signal D1 in synchronization with a rising edge of the fourth divided clock signal QCLKB, and output the latched signal as a second delay bar signal D2B. When the second bit C2<2> of the delay control signal is at a logic high level, the third even latch circuit 813 may latch the second delay bar signal D2B in synchronization with a rising edge of the third divided clock signal QCLK, and output the latched signal as a third delay signal D3. When the third bit C2<3> of the delay control signal is at a logic high level, the fourth even latch circuit 814 may latch the third delay signal D3 in synchronization with a rising edge of the fourth divided clock signal QCLKB, and output the latched signal as a fourth delay bar signal D4B. When the fourth bit C2<4> of the delay control signal is at a logic high level, the fifth even latch circuit 815 may latch the fourth delay bar signal D4B in synchronization with a rising edge of the third divided clock signal QCLK, and output the latched signal as a fifth delay signal D5. The first delay signal D1, the second delay bar signal D2B, the third delay signal D3, the fourth delay bar signal D4B and the fifth delay signal D5 may correspond to the plurality of even delay signals. The signal which is finally generated based on the delay control signal C2<1:4>, among the first delay signal D1, the second delay bar signal D2B, the third delay signal D3, the fourth delay bar signal D4B, and the fifth delay signal D5, may correspond to the output delay signal.

The plurality of odd latch circuits may receive the odd on-pulse signal ONB, the delay control signal C2<1:4>, the fourth divided clock signal QCLKB, and the third divided clock signal QCLK, and generate an output delay bar signal. The plurality of odd latch circuits may generate the output delay bar signal by delaying the odd on-pulse signal ONB alternately in synchronization with the fourth divided clock signal QCLKB and the third divided clock signal QCLK, based on the delay control signal C2<1:4>. The plurality of odd latch circuits may include first to fifth odd latch circuits 821 to 825. The first odd latch circuit 821 may latch the odd on-pulse signal ONB in synchronization with a rising edge of the fourth divided clock signal QCLKB, and output the latched signal as a first delay bar signal D1B. When the first bit C2<1> of the delay control signal is at a logic high level, the second odd latch circuit 822 may latch the first delay bar signal D1B in synchronization with a rising edge of the third divided clock signal QCLK, and output the latched signal as a second delay signal D2. When the second bit C2<2> of the delay control signal is at a logic high level, the third odd latch circuit 823 may latch the second delay signal D2 in synchronization with a rising edge of the fourth divided clock signal QCLKB, and output the latched signal as a third delay bar signal D3B. When the third bit C2<3> of the delay control signal is at a logic high level, the fourth odd latch circuit 824 may latch the third delay bar signal D3B in synchronization with a rising edge of the third divided clock signal QCLK, and output the latched signal as a fourth delay signal D4. When the fourth bit C2<4> of the delay control signal is at a logic high level, the fifth odd latch circuit 825 may latch the fourth delay signal D4 in synchronization with a rising edge of the fourth divided clock signal QCLKB, and output the latched signal as a fifth delay bar signal D5B. The first delay bar signal D1B, the second delay signal D2, the third delay bar signal D3B, the fourth delay signal D4, and the fifth delay bar signal D5B may correspond to the plurality of odd delay signals. The signal which is finally generated based on the delay control signal C2<1:4>, among the first delay bar signal D1B, the second delay signal D2, the third delay bar signal D3B, the fourth delay signal D4, and the fifth delay bar signal D5B, may correspond to the output delay bar signal.

Figure 9:
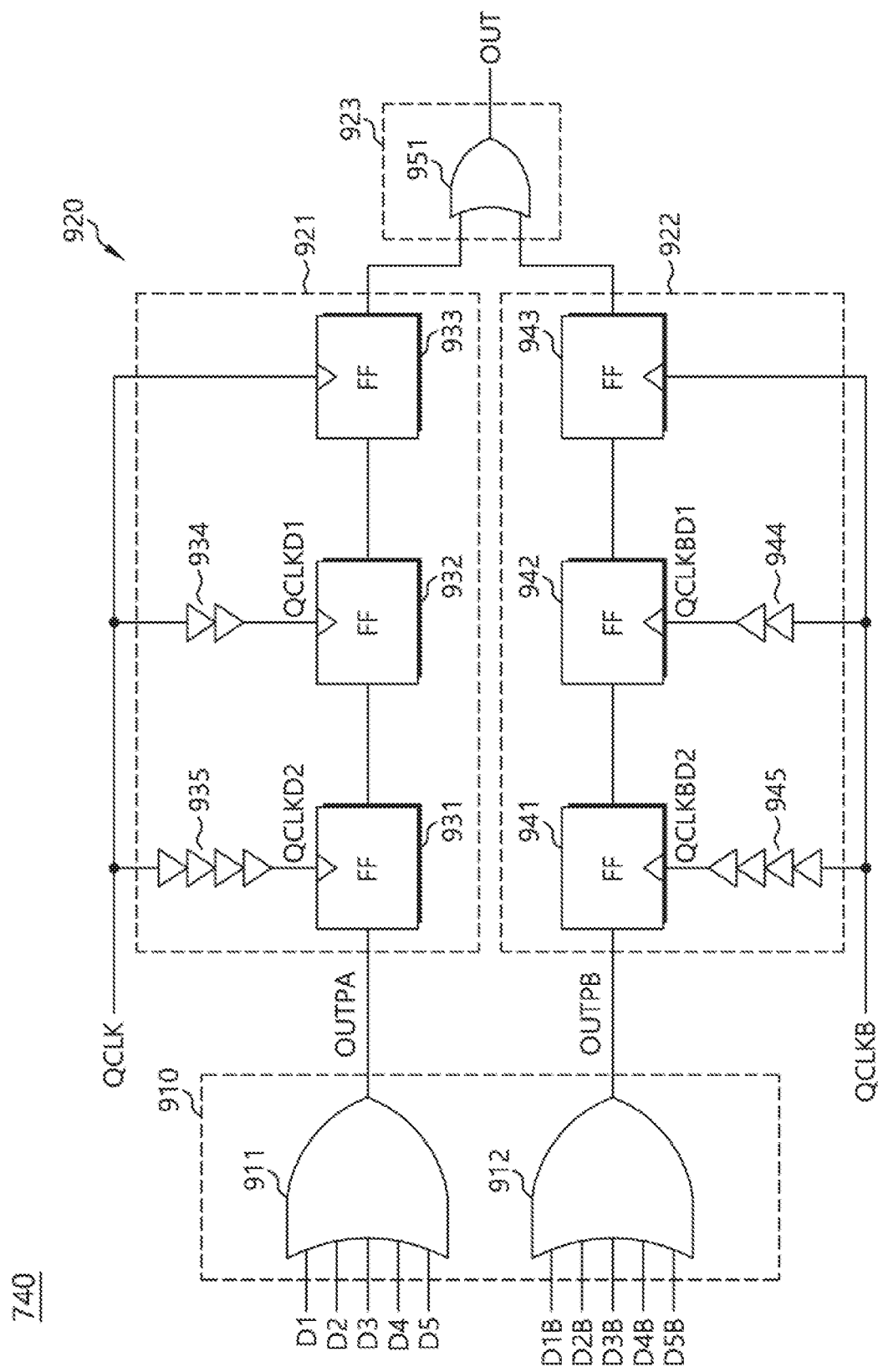
FIG. 9 is a diagram illustrating a configuration of an output signal generation circuit illustrated in FIG. 7.

FIG. 9 is a diagram illustrating the configuration of the output signal generation circuit 740 illustrated in FIG. 7. In FIG. 9, the output signal generation circuit 740 may include a signal summing circuit 910 and a retiming circuit 920. The signal summing circuit 910 may generate the first pre-output signal OUTPA by summing up the delay signals delayed in synchronization with the third divided clock signal QCLK, among the plurality of even delay signals and the plurality of odd delay signals which are generated through the off-pulse generation circuit 730. The signal summing circuit 910 may generate the second pre-output signal OUTPB by summing up the delay signals delayed in synchronization with the fourth divided clock signal QCLKB, among the plurality of even delay signals and the plurality of odd delay signals which are generated through the off-pulse generation circuit 730. Referring to FIG. 9 with FIG. 8, the signal summing circuit 910 may generate the first pre-output signal OUTPA by summing up the pulse widths of the first delay signal D1, the second delay signal D2, the third delay signal D3, the fourth delay signal D4, and the fifth delay signal D5. The signal summing circuit 910 may generate the second pre-output signal OUTPB by summing up the pulse widths of the first delay bar signal D1B, the second delay bar signal D2B, the third delay bar signal D3B, the fourth delay bar signal D4B, and the fifth delay bar signal D5B.

The signal summing circuit 910 may include a first OR gate 911 and a second OR gate 912. The first OR gate 911 may receive the first delay signal D1, the second delay signal D2, the third delay signal D3, the fourth delay signal D4, and the fifth delay signal D5, and output the first pre-output signal OUTPA. The second OR gate 912 may receive the first delay bar signal D1B, the second delay bar signal D2B, the third delay bar signal D3B, the fourth delay bar signal D4B, and the fifth delay bar signal D5B, and output the second pre-output signal OUTPB.

The retiming circuit 920 may retime the first pre-output signal OUTPA based on the third divided clock signal QCLK, and retime the second pre-output signal OUTPB based on the fourth divided clock signal QCLKB. The retiming circuit 920 may generate the output signal OUT by summing up the retimed signals. The retiming circuit 920 may include a first retimer 921, a second retimer 922, and a gating circuit 923. The first retimer 921 may retime the first pre-output signal OUTPA based on the third divided clock signal QCLK, a first delayed clock signal QCLKD1, and a second delayed clock signal QCLKD2. The first and second delayed clock signals QCLKD1 and QCLKD2 may be generated by delaying the third divided clock signal QCLK. The first delayed clock signal QCLKD1 may have a phase that lags behind the third divided clock signal QCLK, and the second delayed clock signal QCLKD2 may have a phase that lags behind the first delayed clock signal QCLKD1. The phase difference between the third divided clock signal QCLK and the first delayed clock signal QCLKD1 may be substantially equal to a phase difference between the first delayed clock signal QCLKD1 and the second delayed clock signal QCLKD2. The first retimer 921 may delay the first pre-output signal OUTPA sequentially in synchronization with the second delayed clock signal QCLKD2, the first delayed clock signal QCLKD1, and the third divided clock signal QCLK.

The second retimer 922 may retime and output the second pre-output signal OUTPB based on the fourth divided clock signal QCLKB, a third delayed clock signal QCLKBD1, and a fourth delayed clock signal QCLKBD2. The third and fourth delayed clock signals QCLKBD1 and QCLKBD2 may be generated by delaying the fourth divided clock signal QCLKB. The third delayed clock signal QCLKBD1 may have a phase that lags behind the fourth divided clock signal QCLKB, and the fourth delayed clock signal QCLKBD2 may have a phase that lags behind the third delayed clock signal QCLKBD1. The phase difference between the fourth divided clock signal QCLKB and the third delayed clock signal QCLKBD1 may be substantially equal to a phase difference between the third delayed clock signal QCLKBD1 and the fourth delayed clock signal QCLKBD2. The second retimer 922 may delay the second pre-output signal OUTPB sequentially in synchronization with the fourth delayed clock signal QCLKBD2, the third delayed clock signal QCLKBD1 and the fourth divided clock signal QCLKB.

The gating circuit 923 may receive an output of the first retimer 921 and an output of the second retimer 922. The gating circuit 923 may generate the output signal OUT by gating the outputs of the first and second retimers 921 and 922. The gating circuit 923 may generate the output signal OUT by summing up the outputs of the first and second retimers 921 and 922. The gating circuit 923 may sum up the pulse widths of the outputs of the first and second retimers 921 and 922.

The signal generation circuit 700 may perform clock domain transformation in the off-pulse generation circuit 730, and the output signal generation circuit 740 may generate the output signal OUT by summing up signals whose clock domains are completely transformed. The output signal generation circuit 740 may generate the first pre-output signal OUTPA by summing up delay signals delayed in synchronization with the third divided clock signal QCLK among the delay signals generated by the off-pulse generation circuit 730, and retime the first pre-output signal OUTPA based on the third divided clock signal QCLK. Therefore, the output signal generation circuit 740 may have a margin corresponding to one period of the third divided clock signal QCLK and/or two periods of the clock signal CLK when retiming the first pre-output signal OUTPA, and perform the retiming operation with a sufficient margin, thereby generating the output signal OUT with more accuracy. The output signal generation circuit 740 may generate the second pre-output signal OUTPB by summing up delay signals delayed in synchronization with the fourth divided clock signal QCLKB among the delay signals generated by the off-pulse generation circuit 730, and retime the second pre-output signal OUTPB based on the fourth divided clock signal QCLKB. Therefore, the output signal generation circuit 740 may have a margin corresponding to one period of the fourth divided clock signal QCLKB and/or two periods of the clock signal CLK when retiming the second pre-output signal OUTPB, and perform the retiming operation with a sufficient margin, thereby generating the output signal OUT with more accuracy.

The first retimer 921 may include a first flip-flop 931, a second flip-flop 932, and a third flip-flop 933. The first flip-flop 931 may output the first pre-output signal OUTPA in synchronization with the second delayed clock signal QCLKD2. The second flip-flop 932 may output the output of the first flip-flop 931 in synchronization with the first delayed clock signal QCLKD1. The third flip-flop 933 may output the output of the second flip-flop 932 in synchronization with the third divided clock signal QCLK. The first retimer 921 may further include delay units 934 and 935 configured to generate the first and second delayed clock signals QCLKD1 and QCLKD2 by delaying the third divided clock signal QCLK by a predetermined time. The second retimer 922 may include a fourth flip-flop 941, a fifth flip-flop 942, and a sixth flip-flop 943. The fourth flip-flop 941 may output the second pre-output signal OUTPB in synchronization with the fourth delayed clock signal QCLKBD2. The fifth flip-flop 942 may output the output of the fourth flip-flop 941 in synchronization with the third delayed clock signal QCLKBD1. The sixth flip-flop 943 may output the output of the fifth flip-flop 942 in synchronization with the fourth divided clock signal QCLKB. The second retimer 922 may further include delay units 944 and 945 configured to generate the third and fourth delayed clock signals QCLKBD1 and QCLKBD2 by delaying the fourth divided clock signal QCLKB by a predetermined time. The gating circuit 923 may include a third OR gate 951. The third OR gate 951 may sum up the output of the third flip-flop 933 and the output of the sixth flip-flop 943, and output the output signal OUT.

Figure 10:
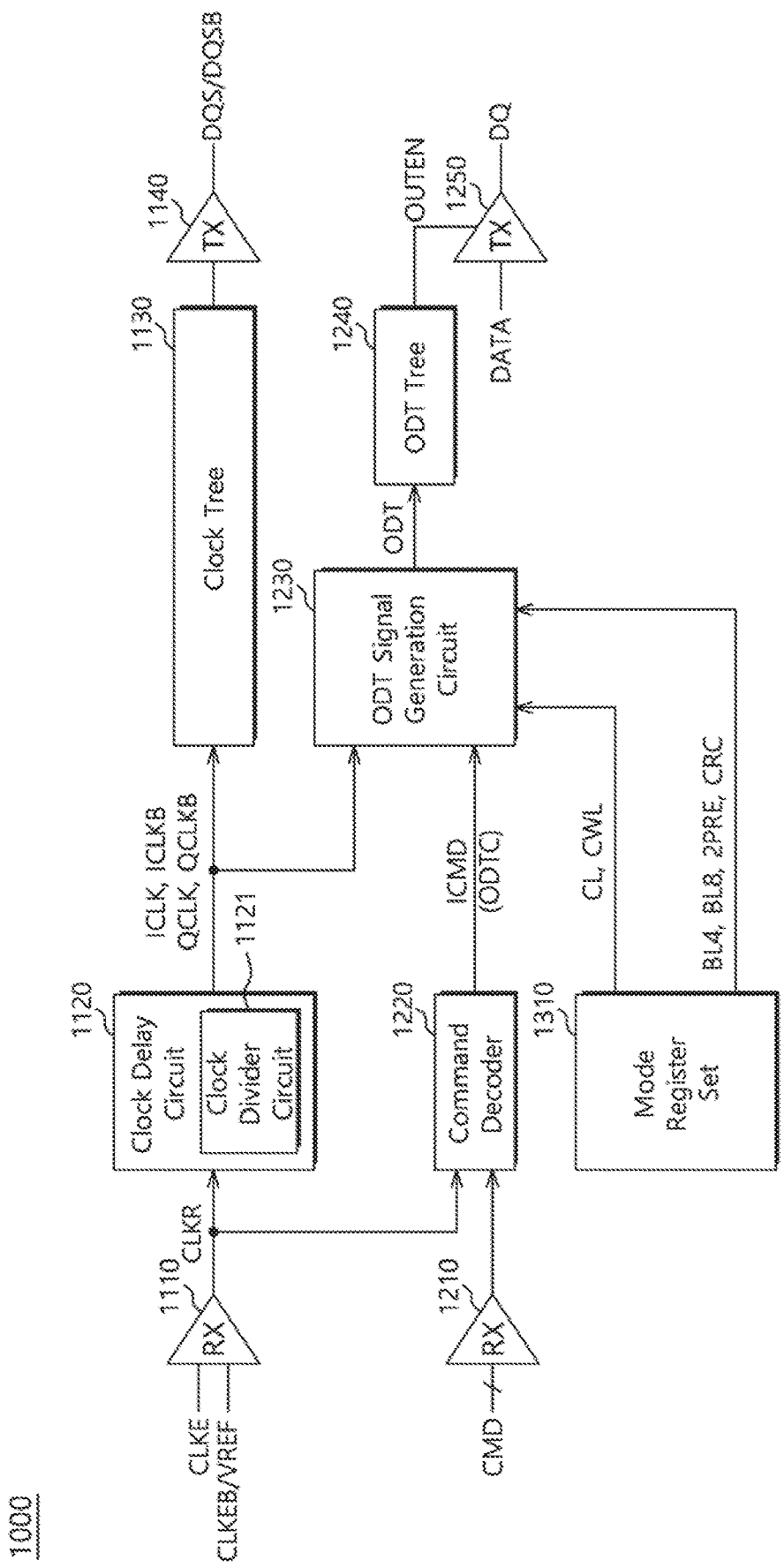
FIG. 10 is a diagram illustrating a configuration of a semiconductor apparatus in accordance with an embodiment.

FIG. 10 is a diagram illustrating a configuration of a semiconductor apparatus 1000 in accordance with an embodiment. In FIG. 10, the semiconductor apparatus 1000 may include a clock receiver 1110, a clock delay circuit 1120, a clock tree 1130, a strobe transmitter 1140, a command receiver 1210, a command decoder 1220, an ODT (On-Die Termination) signal generation circuit 1230, an ODT tree 1240, a data transmitter 1250, and a mode register set 1310. The clock receiver 1110 may receive an external clock signal CLKE transmitted from an external device. The external clock signal CLKE may be transmitted as a single-ended signal, or transmitted as a differential signal with a complementary signal CLKEB. In an embodiment, the clock receiver 1110 may generate a reference clock signal RCLK by differentially amplifying the external clock signals CLKE and CLKEB transmitted as differential signals. In an embodiment, the clock receiver 1110 may generate the reference clock signal RCLK by differentially amplifying a reference voltage VREF and the external clock signal CLKE transmitted as a single-ended signal. The reference voltage VREF may have a voltage level corresponding to the middle of the swing range of the external clock signal CLKE. The external clock signal CLKE and/or the reference clock signal RCLK may correspond to the clock signal CLK illustrated in FIG. 1.

The clock delay circuit 1120 may compensate for a delay amount by which the external clock signal CLKE is delayed through an internal circuit of the semiconductor apparatus 1000. The clock delay circuit 1120 may generate a delay-locked clock signal synchronized with the external clock signal CLKE by delaying the reference clock signal RCLK. The clock delay circuit 1120 may include a delay locked loop circuit configured to generate the delay-locked clock signal by delaying the reference clock signal RCLK. The clock delay circuit 1120 may include a clock divider circuit 1121. The clock divider circuit 1121 may generate a plurality of divided clock signals ICLK, ICLKB, QCLK, and QCLKB by dividing the frequency of the delay-locked clock signal. For example, the clock divider circuit 1121 may generate the first divided clock signal ICLK, the second divided clock signal ICLKB, the third divided clock signal QCLK, and the fourth divided clock signal QCLKB by dividing the frequency of the delay-locked clock signal by 2. The first divided clock signal ICLK may have a phase that leads the third divided clock signal QCLK by 90 degrees, and the third divided clock signal QCLK may have a phase that leads the second divided clock signal ICLKB by 90 degrees. The second divided clock signal ICLKB may have a phase that leads the fourth divided clock signal QCLKB by 90 degrees, and the fourth divided clock signal QCLKB may have a phase that leads the first divided clock signal ICLK by 90 degrees. Because the external clock signal CLKE has a relatively high frequency, the semiconductor apparatus 1000 may operate using the divided clock signals ICLK, ICLKB, QCLK, and QCLKB generated by dividing the frequency of the external clock signal CLKE, in order to increase an operation timing margin of the internal circuits. The first to fourth divided clock signals ICLK, ICLKB, QCLK, and QCLKB may correspond to the first to fourth divided clock signals ICLK, ICLKB, QCLK, and QCLKB illustrated in FIG. 1, respectively. Although not illustrated, the clock delay circuit 1120 may further include a duty cycle correction circuit. The duty cycle correction circuit may correct the duty ratios of the first to fourth divided clock signals ICLK, ICLKB, QCLK, and QCLKB, such that the first to fourth divided clock signals ICLK, ICLKB, QCLK, and QCLKB have a duty ratio of 50%.

The clock tree 1130 may delay the first to fourth divided clock signals ICLK, ICLKB, QCLK, and QCLKB, and output the delayed signals. The first to fourth divided clock signals ICLK, ICLKB, QCLK, and QCLKB generated through the clock delay circuit 1120 may be outputted the strobe transmitter 1140 through the clock tree 1130. The strobe transmitter 1140 may output the signal outputted from the clock tree 1130 as a data strobe signal DQS/DQSB to an external device. The data strobe signals DQS/DQSB may be outputted to the external device in synchronization with data DQ outputted from the semiconductor apparatus 1000. The data strobe signal DQS may be transmitted to the external device through a bus.

The command receiver 1210 may receive a command signal CMD transmitted from the external device. The command signal CMD may include a plurality of signals. The command signal CMD may include various pieces of information for controlling the semiconductor apparatus 1000 to perform a variety of operations. For example, the command signal CMD may include information for controlling the semiconductor apparatus 1000 to perform a termination operation. The termination operation may indicate an operation of setting a termination resistance value of a bus to which the semiconductor apparatus 1000 transmits data or a data strobe signal. For example, when the termination operation is performed, the data transmitter 1250 may be set to have the termination resistance value.

The command decoder 1220 may latch the command signal CMD received through the command receiver 1210 based on the reference clock signal RCLK, decode the latched signal, and output the decoded signal as an internal command signal ICMD. The command decoder 1220 may generate various internal command signals ICMD according to information included in the command signal CMD. The internal command signal ICMD may include a termination command signal ODTC.

The ODT signal generation circuit 1230 may receive the termination command signal ODTC generated through the command decoder 1220. The signal generation circuits 100 and 700 illustrated in FIGS. 1 and 7 may be applied as the ODT signal generation circuit 1230. The termination command signal ODTC may correspond to the input signal IN illustrated in FIGS. 1 and 7. The ODT signal generation circuit 1230 may perform a domain crossing operation on the termination command signal ODTC, and generate an on-die termination signal ODT based on the termination command signal ODTC. The on-die termination signal ODT may correspond to the output signal OUT illustrated in FIGS. 1 and 7. Because the termination command signal ODTC is delayed asynchronously with the reference clock signal RCLK, the ODT signal generation circuit 1230 may generate the on-die termination signal ODT by synchronizing the termination command signal ODTC with the first to fourth divided clock signals ICLK, ICLKB, QCLK, and QCLKB. The ODT signal generation circuit 1230 may generate the on-die termination signal ODT based on first time information and second time information. For example, the ODT signal generation circuit 1230 may generate the on-die termination signal ODT which is enabled after a predetermined time based on the first time information has passed because the termination command signal ODTC was enabled, and retains the enabled state during a time corresponding to the second time information.

The mode register set 1310 may provide the first time information and the second time information to the ODT signal generation circuit 1230. The mode register set 1310 may include various pieces of operation setting information related to various operations of the semiconductor apparatus 1000. The first time information may include column address strobe latency CL and/or column address strobe write latency CWL, for example. The ODT signal generation circuit 1230 may receive the column address strobe latency CL and/or the column address strobe write latency CWL, decide shifting latency from the column address strobe latency CL and/or the column address strobe write latency CWL, and delay the termination command signal ODTC based on the shifting latency. The shifting latency may have a smaller value than the column address strobe latency CL and/or the column address strobe write latency CWL. The shifting latency may correspond to the first delay information LT1 illustrated in FIGS. 1 and 7. The second time information may include one or more of a BL4 signal, a BL8 signal, a 2PRE signal, and a CRC (Cyclic Redundancy Check) signal. The BL4 signal may indicate that a burst length is 4, and include information for setting an operation in which four data are successively outputted. The BL8 signal may indicate that a burst length is 8, and include information for setting an operation in which eight data are successively outputted. The 2PRE signal may include information for setting an operation in which the pre-amble of a data strobe signal used for transmitting data is generated during two periods of the external clock signal CLKE. The CRC signal may include information for setting an operation in which CRC information is continuously outputted after data are outputted during a time corresponding to the burst length. The BL4 signal, the BL8 signal, the 2PRE signal and the CRC signal may correspond to the second delay information LT2 illustrated in FIGS. 1 and 7. For example, the BL4 signal may correspond to the first bit C1<1> or C2<1> of the delay control signal, the BL8 signal may correspond to the second bit C1<2> or C2<2> of the delay control signal, the 2PRE signal may correspond to the third bit C1<3> or C2<3> of the delay control signal, and the CRC signal may correspond to the fourth bit C1<4> or C2<4> of the delay control signal. The ODT signal generation circuit 1230 may enable the on-die termination signal ODT after a time corresponding to the shifting latency has elapsed because the termination command signal ODTC was inputted, and the pulse of the on-die termination signal ODT may be retained during a time which is determined based on one or more of the BL4 signal, the BL8 signal, the 2PRE signal, and the CRC signal.

The ODT tree 1240 may generate an on-die termination enable signal ODTEN by delaying the on-die termination signal ODT. The on-die termination signal ODT may be inputted to the data transmitter 1250 through the ODT tree 1240. The data transmitter 1250 may be set to have a termination resistance value when the on-die termination enable signal ODTEN is received. After the data transmitter 1250 is set to have the termination resistance value based on the on-die termination enable signal ODTEN, the data transmitter 1250 may output data DQ to the external device based on internal data DATA of the semiconductor apparatus 1000. The termination resistance value may have a resistance value matched with impedance of a receiving terminal of the bus, i.e. the external device.

While the delay amount by a clock path including the clock delay circuit 1120 and the clock tree 1130 may be easily reduced through design, the delay amount of a command path including the command decoder 1220 and the ODT signal generation circuit 1230 is difficult to reduce, because the ODT signal generation circuit 1230 needs to convert the on-die termination command signal ODTC into a signal synchronized with the clock signal. Therefore, a mismatch may occur between the time at which the divided clock signals ICLK, QCLK, ICLKB, and QCLKB arrive at the strobe transmitter 1140 and the time at which the on-die termination command signal ODTC arrives at the data transmitter 1250. Furthermore, the ODT signal generation circuit 1230 needs to generate the on-die termination enable signal ODTEN which is enabled at constant timing for operation reliability of the semiconductor apparatus 1000 and has a predetermined pulse width. Therefore, the ODT signal generation circuit 1230 may include the signal generation circuits 100 and 1700 illustrated in FIGS. 1 and 7.

While various embodiments have been described above, it will be understood to those skilled in the art that the embodiments described are examples only. Accordingly, the signal generation circuit described herein should not be limited based on the described embodiments.

What is claimed is:

1. A signal generation circuit comprising:
   a clock divider circuit configured to generate a first divided clock signal, a second divided clock signal, a third divided clock signal, and a fourth divided clock signal based on a clock signal;
   an on-pulse generation circuit configured to delay an input signal in synchronization with the first and second divided clock signals to generate an even on-pulse signal and an odd on-pulse signal, based on first delay information;
   an off-pulse generation circuit configured to sequentially delay the even on-pulse signal alternately in synchronization with the second divided clock signal and the first divided clock signal to generate a plurality of even delay signals, based on second delay information, and to sequentially delay the odd on-pulse signal alternately in synchronization with the first divided clock signal and the second divided clock signal to generate a plurality of odd delay signals, based on the second delay information; and
   an output signal generation circuit configured to generate a first pre-output signal based on the even on-pulse signal and the delay signals delayed in synchronization with the second divided clock signal, among the plurality of even and odd delay signals, generate a second pre-output signal based on the odd on-pulse signal and the delay signals delayed in synchronization with the first divided clock signal, among the plurality of even and odd delay signals, and synchronize the first pre-output signal with the fourth divided clock signal and synchronize the second pre-output signal with the third divided clock signal to generate an output signal.

2. The signal generation circuit according to claim 1, wherein the clock divider circuit generates the first to fourth divided clock signals by dividing the frequency of the clock signal by m, and the first to fourth divided clock signals have a same phase difference therebetween, wherein m is an integer equal to or greater than two.

3. The signal generation circuit according to claim 1, wherein the on-pulse generation circuit comprises:
   an even shifting circuit configured to delay the input signal by at least a part of a time determined from the first delay information to generate an even synchronization signal;
   an odd shifting circuit configured to delay the input signal by at least the part of the time determined from the first delay information to generate an odd synchronization signal; and
   a switching circuit configured to output the even synchronization signal as the odd on-pulse signal based on at least a part of the first delay information or generate the even on-pulse signal by additionally delaying the even synchronization signal, and output the odd synchronization signal as the even on-pulse signal based on at least a part of the first delay information or generate the odd on-pulse signal by additionally delaying the odd synchronization signal.

4. The signal generation circuit according to claim 3, wherein the switching circuit comprises:
   a first latch circuit configured to latch the even synchronization signal in synchronization with the second divided clock signal based on an odd control signal;
   a second latch circuit configured to latch the odd synchronization signal in synchronization with the first divided clock signal based on the odd control signal;
   a first gate circuit configured to gate the odd synchronization signal as a complementary signal of the odd control signal;
   a second gate circuit configured to gate the even synchronization signal as the complementary signal of the odd control signal;
   a third gate circuit configured to gate outputs of the first latch circuit and the first gate circuit and output the even on-pulse signal; and
   a fourth gate circuit configured to gate outputs of the second latch circuit and the second gate circuit and output the odd on-pulse signal.

5. The signal generation circuit according to claim 1, wherein the off-pulse generation circuit comprises:
   a first flip-flop configured to invert and delay the even on-pulse signal in synchronization with the second divided clock signal;
   a plurality of even latch circuits configured to sequentially delay an output of the first flip-flop alternately in synchronization with the first divided clock signal and the second divided clock signal based on the second delay information, and output a part of the plurality of delay signals;
   a second flip-flop configured to invert and delay the odd on-pulse signal in synchronization with the first divided clock signal; and a plurality of odd latch circuits configured to sequentially delay an output of the second flip-flop alternately in synchronization with the second divided clock signal and the first divided clock signal based on the second delay information, and output other part of the plurality of delay signals.

6. The signal generation circuit according to claim 1, wherein the output signal generation circuit comprises:
a signal summing circuit configured to generate the first pre-output signal by summing up the even on-pulse signal and the delay signals delayed in synchronization with the second divided clock signal, and generate the second pre-output signal by summing up the odd on-pulse signal and the delay signals delayed in synchronization with the first divided clock signal; and
a clock domain transformation circuit configured to latch the first pre-output signal in synchronization with the fourth divided clock signal, latch the second pre-output signal in synchronization with the third divided clock signal, and generate the output signal by summing up the latched signals.

7. The signal generation circuit according to claim 6, wherein the clock domain transformation circuit comprises a symmetric NAND gate configured to perform NAND gating on the latched signals.

8. The signal generation circuit according to claim 7, wherein the symmetric NAND gate comprises:
a first transistor coupled between a first supply voltage terminal and an output node, and configured to receive a signal latched in synchronization with the fourth divided clock signal through a gate thereof;
a second transistor coupled between the first supply voltage terminal and the output node, and configured to receive a signal latched in synchronization with the third divided clock signal through a gate thereof;
a third transistor having one terminal coupled to the output node, and configured to receive a signal latched in synchronization with the fourth divided clock signal through a gate thereof;
a fourth transistor having one terminal coupled to the output node, and configured to receive a signal latched in synchronization with the third divided clock signal through a gate thereof;
a fifth transistor coupled between a second supply voltage terminal and the other terminal of the third transistor, and configured to receive a signal latched in synchronization with the third divided clock signal through a gate thereof; and
a sixth transistor coupled between the second supply voltage terminal and the other terminal of the fourth transistor, and configured to receive a signal latched in synchronization with the fourth divided clock signal through a gate thereof.

9. A signal generation circuit comprising:
a clock divider circuit configured to generate a first divided clock signal, a second divided clock signal, a third divided clock signal, and a fourth divided clock signal based on a clock signal;
an on-pulse generation circuit configured to delay an input signal in synchronization with the first divided clock signal and the second divided clock signal to generate an even on-pulse signal and an odd on-pulse signal, based on first delay information;
an off-pulse generation circuit configured to delay the even on-pulse signal alternately in synchronization with the third divided clock signal and the fourth divided clock signal to generate a plurality of even delay signals, based on second delay information, and delay the odd on-pulse signal alternately in synchronization with the fourth divided clock signal and the third divided clock signal to generate a plurality of odd delay signals, based on the second delay information; and
an output signal generation circuit configured to generate a first pre-output signal based on the even and odd delay signals delayed in synchronization with the third divided clock signal, generate a second pre-output signal based on the even and odd delay signals delayed in synchronization with the fourth divided clock signal, and generate an output signal by retiming the first pre-output signal based on the third divided clock signal and retiming the second pre-output signal based on the fourth divided clock signal.

10. The signal generation circuit according to claim 9, wherein the clock divider circuit generates the first to fourth divided clock signals by dividing the frequency of the clock signal by m, and the first to fourth divided clock signals have a same phase difference therebetween, wherein m is an integer equal to or greater than two.

11. The signal generation circuit according to claim 9, wherein the on-pulse generation circuit comprises:
an even shifting circuit configured to delay the input signal by at least a part of a time determined from the first delay information to generate an even synchronization signal;
an odd shifting circuit configured to delay the input signal by at least the part of the time determined from the first delay information to generate an odd synchronization signal; and
a switching circuit configured to output the even synchronization signal as the odd on-pulse signal based on at least a part of the first delay information or generate the even on-pulse signal by additionally delaying the even synchronization signal, and output the odd synchronization signal as the even on-pulse signal based on at least a part of the first delay information or generate the odd on-pulse signal by additionally delaying the odd synchronization signal.

12. The signal generation circuit according to claim 11, wherein the switching circuit comprises:
a first latch circuit configured to latch the even synchronization signal in synchronization with the second divided clock signal based on an odd control signal;
a second latch circuit configured to latch the odd synchronization signal in synchronization with the first divided clock signal based on the odd control signal;
a first gate circuit configured to gate the odd synchronization signal as a complementary signal of the odd control signal;
a second gate circuit configured to gate the even synchronization signal as the complementary signal of the odd control signal;
a third gate circuit configured to gate outputs of the first latch circuit and the first gate circuit and output the even on-pulse signal; and
a fourth gate circuit configured to gate outputs of the second latch circuit and the second gate circuit and output the odd on-pulse signal.

13. The signal generation circuit according to claim 11, wherein the off-pulse generation circuit comprises:
a first latch configured to latch the even on-pulse signal in synchronization with the third divided clock signal;
an even latch circuit configured to generate a plurality of delay signals by sequentially latching an output of the first latch alternately in synchronization with the fourth divided clock signal and the third divided clock signal based on the second delay information;

a second latch configured to latch the odd on-pulse signal in synchronization with the fourth divided clock signal; and a plurality of odd latch circuits configured to sequentially latch an output of the second latch alternately in synchronization with the third divided clock signal and the fourth divided clock signal based on the second delay information.

14. The signal generation circuit according to claim 11, wherein the output signal generation circuit comprises:

a signal summing circuit configured to generate the first pre-output signal by summing up the delay signals delayed in synchronization with the third divided clock signal, and generate the second pre-output signal by summing up the delay signals delayed in synchronization with the fourth divided clock signal; and a retiming circuit configured to generate the output signal by retiming the first pre-output signal based on the third divided clock signal and retiming the second pre-output signal based on the fourth divided clock signal.

15. The signal generation circuit according to claim 14, wherein the retiming circuit comprises:

a first retimer configured to retime the first pre-output signal based on the third divided clock signal, a first delayed clock signal, and a second delayed clock signal;

a second retimer configured to retime the second pre-output signal based on the fourth divided clock signal, a third delayed clock signal, and a fourth delayed clock signal; and a gating circuit configured to gate outputs of the first and second retimers and output the output signal.

16. The signal generation circuit according to claim 15, wherein the first retimer comprises:

a first flip-flop configured to retime the first pre-output signal in synchronization with the second delayed clock signal;

a second flip-flop configured to retime a signal outputted from the first flip-flop in synchronization with the first delayed clock signal; and a third flip-flop configured to retime a signal outputted from the second flip-flop in synchronization with the third divided clock signal, and output the retimed signal to the gating circuit, wherein the first delayed clock signal has a phase that lags behind the third divided clock signal, and the second delayed clock signal has a phase that lags behind the first delayed clock signal.

17. The signal generation circuit according to claim 15, wherein the second retimer comprises:

a first flip-flop configured to retime the second pre-output signal in synchronization with the fourth delayed clock signal;

a second flip-flop configured to retime a signal outputted from the first flip-flop in synchronization with the third delayed clock signal; and a third flip-flop configured to retime a signal outputted from the second flip-flop in synchronization with the fourth divided clock signal, and output the retimed signal to the gating circuit, wherein the third delayed clock signal has a phase that lags behind the fourth divided clock signal, and the fourth delayed clock signal has a phase that lags behind the third delayed clock signal.

* * * * *